United States Patent [19]

Abe et al.

[11] Patent Number: 5,068,684
[45] Date of Patent: Nov. 26, 1991

[54] IMAGE FORMING DEVICE

[75] Inventors: Nobumasa Abe; Atsushi Kobayashi; Koji Watanabe; Norio Morishita; Yuji Tanaka, all of Suwa, Japan

[73] Assignee: Seiko Epson Corporation, Tokyo, Japan

[21] Appl. No.: 391,902

[22] Filed: Aug. 8, 1989

[30] Foreign Application Priority Data

| Aug. 9, 1988 | [JP] | Japan | 63-198502 |
| Nov. 22, 1988 | [JP] | Japan | 63-295062 |
| Apr. 17, 1989 | [JP] | Japan | 1-97182 |
| Apr. 21, 1989 | [JP] | Japan | 1-102282 |

[51] Int. Cl.⁵ .................................................. G03B 27/32
[52] U.S. Cl. .................................. 355/27; 355/30; 355/72
[58] Field of Search .................. 355/27, 28, 30, 72, 355/285, 286, 287, 288; 219/216; 430/138

[56] References Cited

U.S. PATENT DOCUMENTS

| 3,219,446 | 11/1965 | Berman | 430/138 |
| 4,202,618 | 5/1980 | Waschk et al. | 355/30 X |
| 4,939,536 | 7/1990 | Matsumoto et al. | 355/30 X |
| 4,945,374 | 7/1990 | Yamamoto et al. | 355/27 |
| 4,945,381 | 7/1990 | Yamagata et al. | 355/72 X |

Primary Examiner—Brian W. Brown
Assistant Examiner—Khanh Dang

[57] ABSTRACT

An image forming device including a photosensitive member, a development device and a thermal treating device is provided to form an image on a sheet of paper. The development device uses pressure rollers to develop the paper under pressure and includes a mechanism for varying the pressure. A movable shutter controls the amount of radiant heat provided by the thermal treatment device. When the power is turned off, the shutter closes to prevent further heating. The image forming device also includes a device for removing gases formed during the image forming process.

59 Claims, 17 Drawing Sheets

FIG. 2
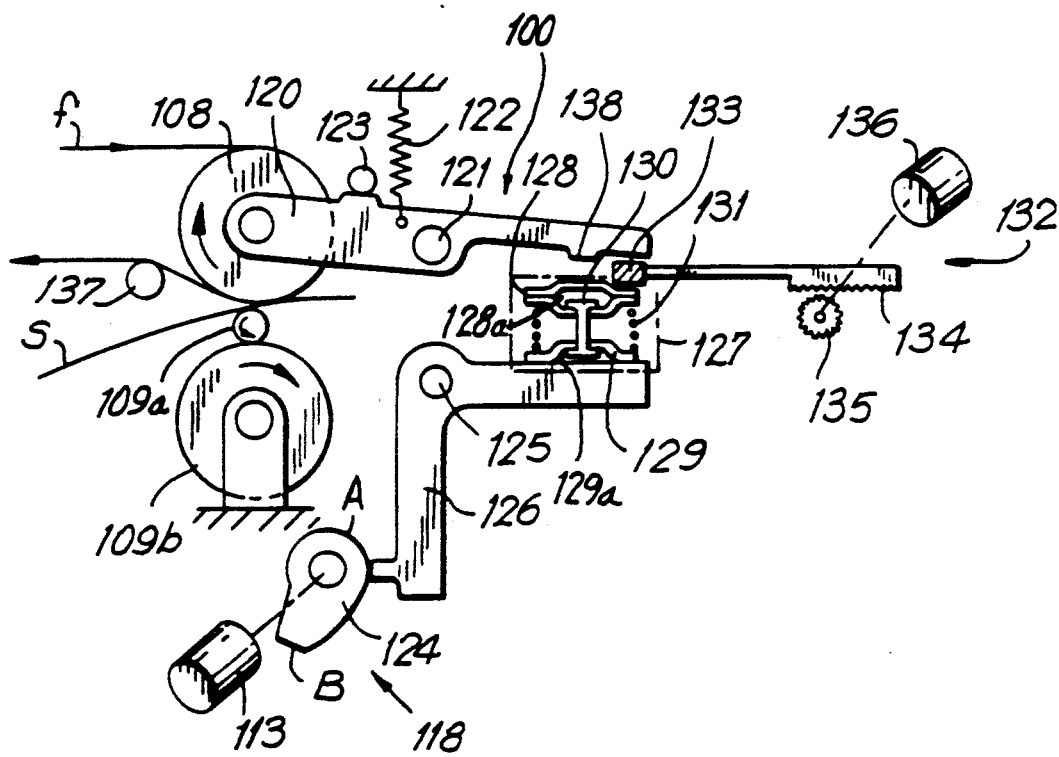
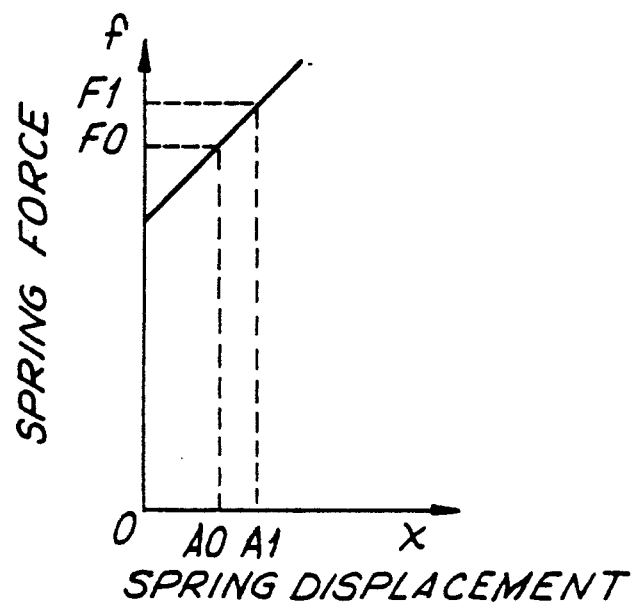
FIG.3

IMAGE FORMING DEVICE

BACKGROUND OF THE INVENTION

This invention relates generally to an image forming device and more particularly to an image forming device which exposes a photosensitive member to an optical image and transfers the image to a sheet of paper.

Various methods of forming images using photosensitive materials which harden or soften when exposed to light are disclosed in U.S. Pat. No. 3,219,446 and Japanese Patent Laid-Open Nos. 88739/83 and 30537/84. Each of these methods employs photosensitive materials which are transferred. The creation of images requires control of the transferability of these materials. Subsequent to exposure, these methods involve simpler steps than a silver salt photographic method and offer better image quality by gradation than electrophotography.

Conventional methods which utilize photosensitive materials which harden or soften when exposed to light employ development devices which apply constant pressure. However, depending on the width, thickness and the quality of the paper on which the image is reproduced, as the image concentration changes, the homogeneity of the concentration is lost, and creases are produced.

In conventional methods, when the power is turned off by the operator or the power fails, the paper overheats and scorches or decomposes resulting in the production of poisonous gases. Irritating gases are also produced during normal operation of conventional image forming devices.

Accordingly, it is desirable to provide an image forming device which varies pressure during development, does not overheat the paper when the power is turned off and which has a device for removing gas produced during the development process.

SUMMARY OF THE INVENTION

Generally speaking, in accordance with the invention, an image forming device is provided. The iamge forming device includes a container for holding a photosensitive member, an exposure device for exposing the photosensitive member to an optical image, a development device for superimposing the photosensitive member on a sheet on which a visible image is to be created and a thermal treating device. The photosensitive member includes microcapsules which include a color former and a material which hardens or softens when exposed to light.

The development device utilizes pressure rollers to develop the image on the sheet under pressure and includes a mechanism for varying the pressure. The development device may also contain a portion to detect the size of the sheet on which the image is formed.

A movable shutter controls the amount of radiant heat provided by the thermal treatment device. When the power is turned off, the shutter closes to prevent further heating and therefore to prevent scorching of the sheet on which the image is formed.

The image forming device also includes a device for removing gases formed during the image forming process. The device includes a gas filter and an exhaust duct mounted in the lower portion of the image forming device.

Accordingly, it is an object of the invention to provide an improved image forming device capable of forming high quality images.

An other object of the invention is to provide a lustrous and vivid image.

A further object of the invention is to provide a thermal treating device capable of varying the glossiness according to taste.

Still another object of the invention is to provide a thermal treating device which is easy to assemble and reliable.

Still a further object of the invention is provide a safe thermal treating device.

Another object of the invention is to provide a thermal treating device which does not overheat the paper if the power is turned off or fails.

Yet another object of the invention is to provide an image forming device which does not release poisonous gases when the power is turned off or fails.

Still a further object of the invention is to provide a thermal treating device which does not release irritating gases.

Still another object of the invention is to provide an image forming device containing a gas filter which is easily and safely installed or removed.

Still other objects and advantages of the invention will in part be obvious and will in part be apparent from the specification and drawings.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 2 illustrates a pressure-adjusting device of a development device in accordance with the invention;

FIG. 3 is a graph showing the characteristic of the pressure applied by the mechanism shown in FIG. 2;

Figure 13:
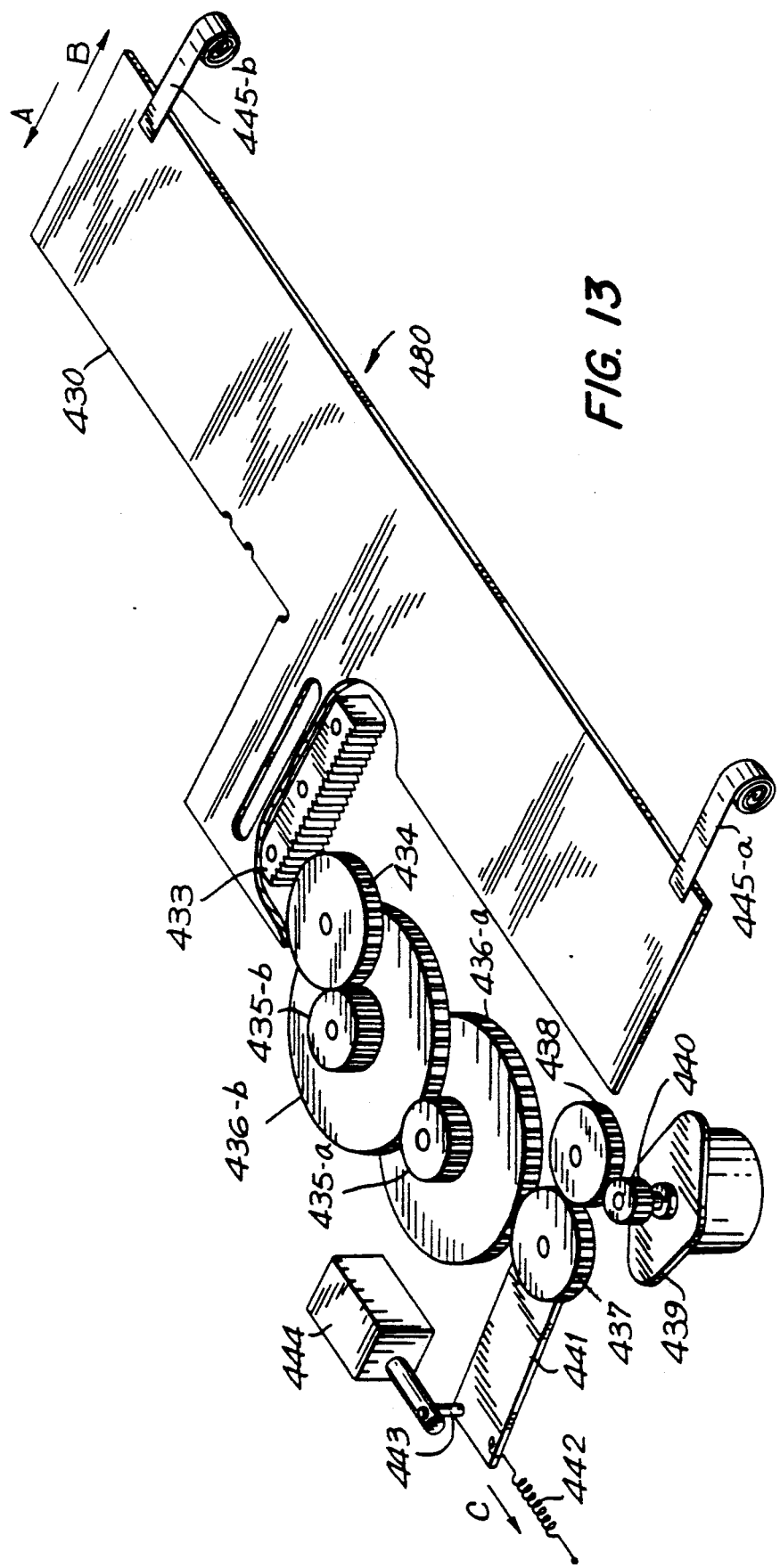
Figure 15:
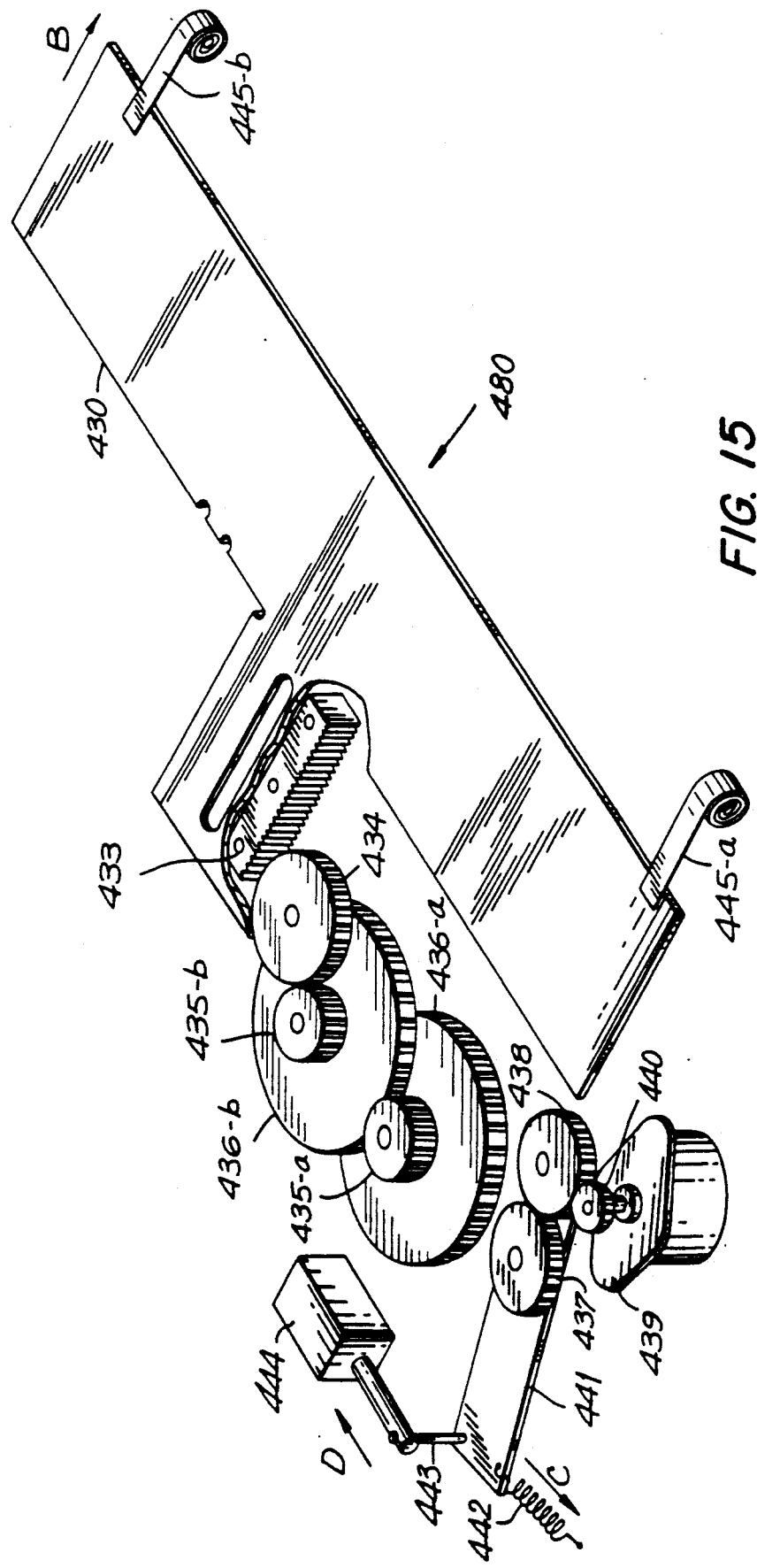
Figure 16:
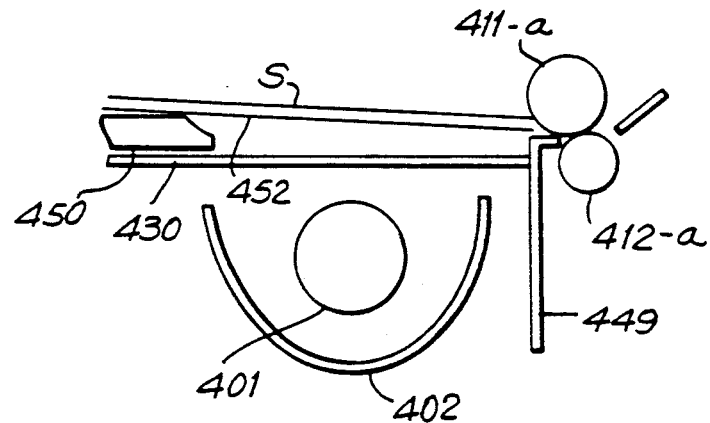
Figure 17:
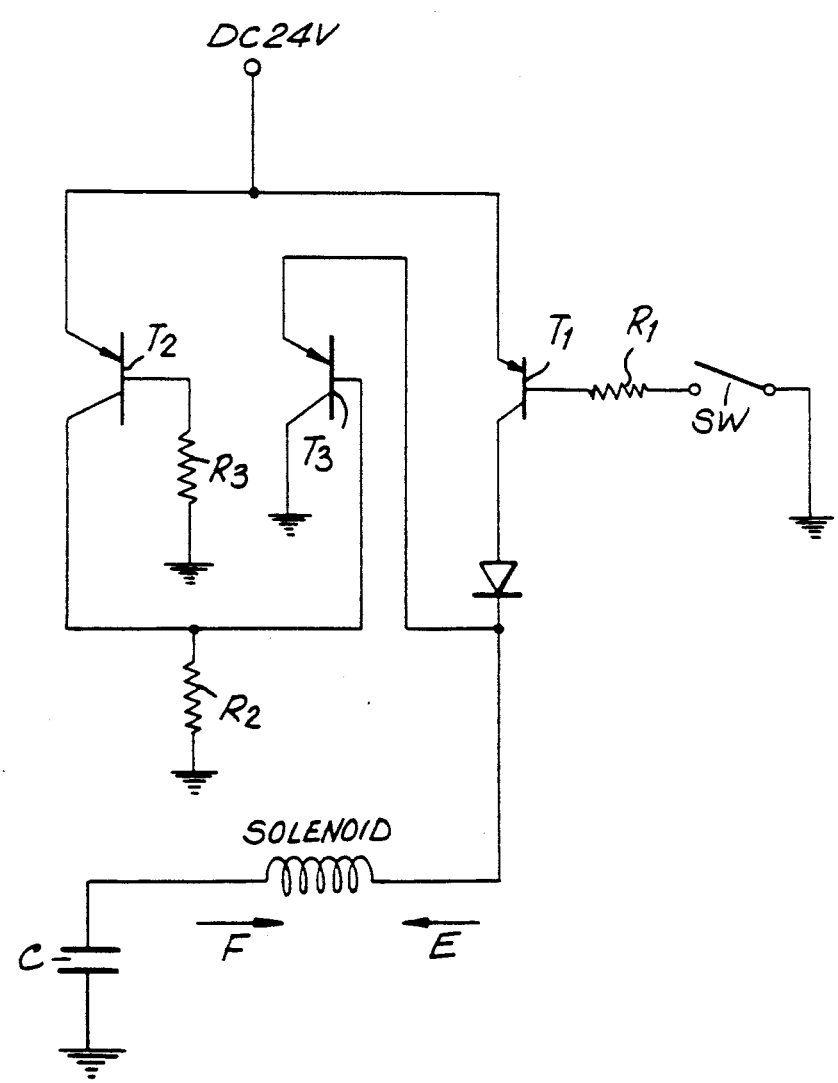
Figure 18:
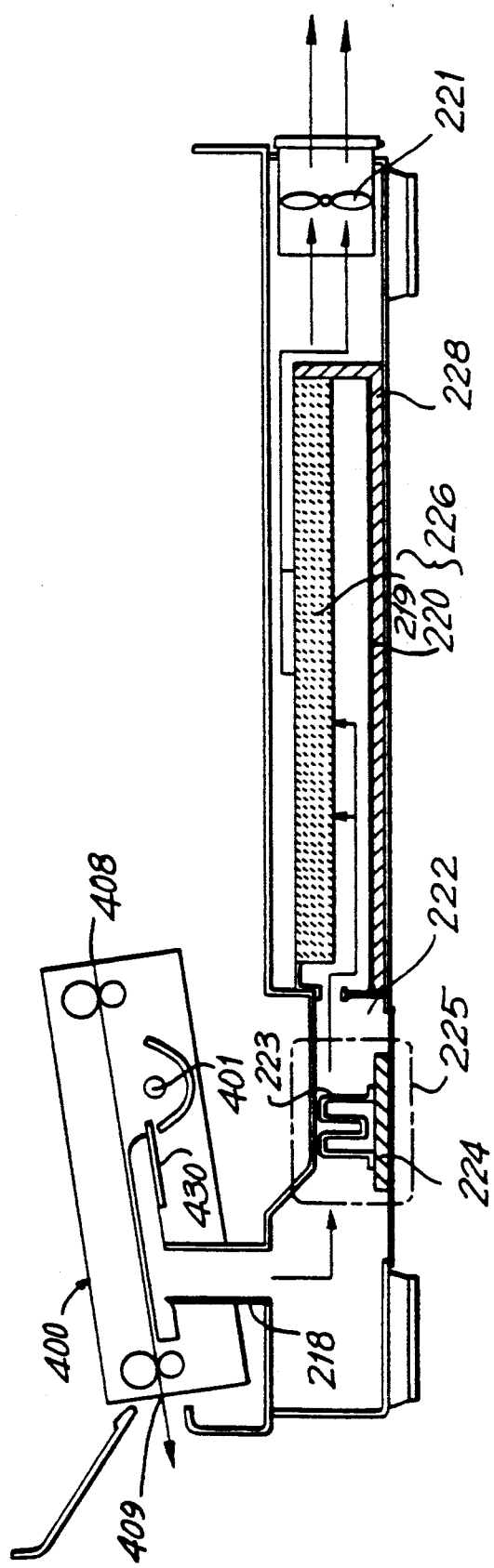
Figure 19:
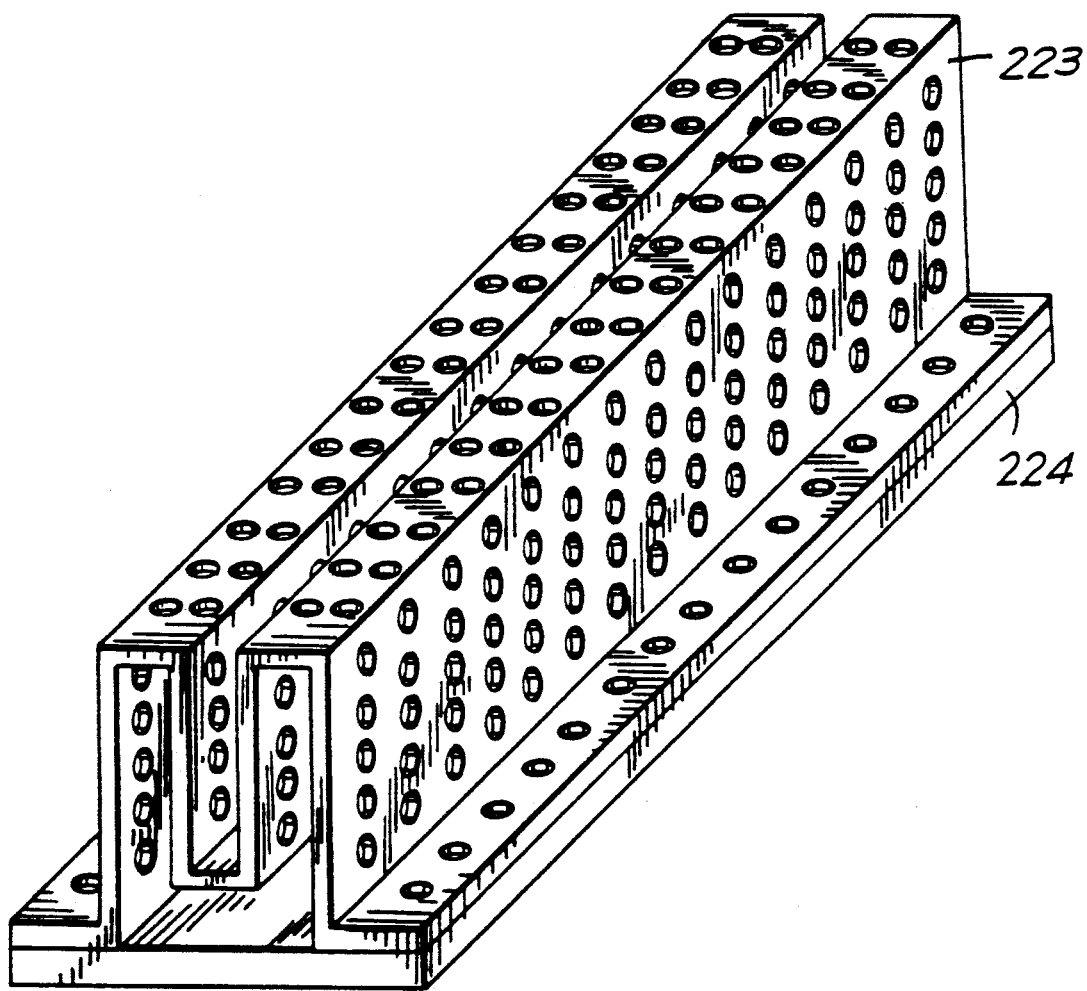
Figure 20:
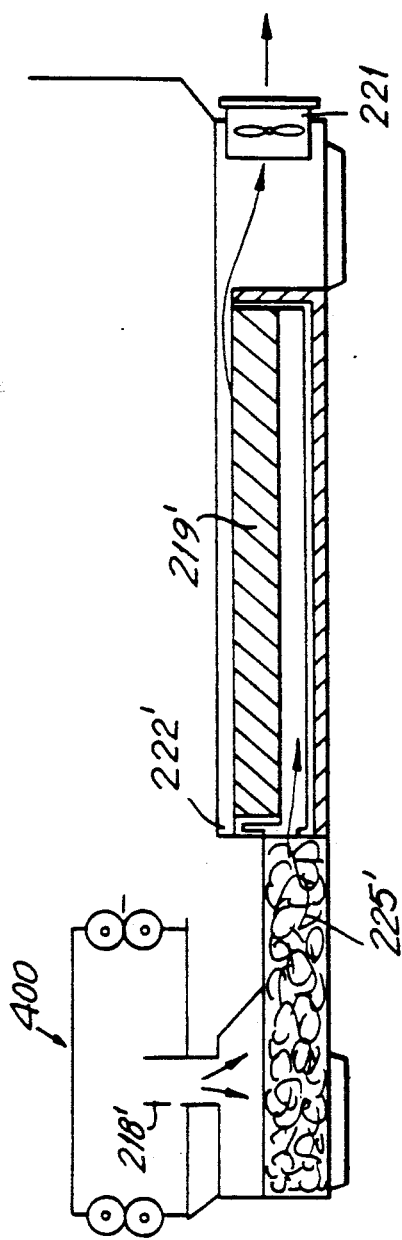
Figure 22:
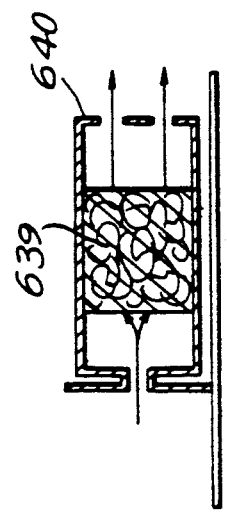
Figure 21:
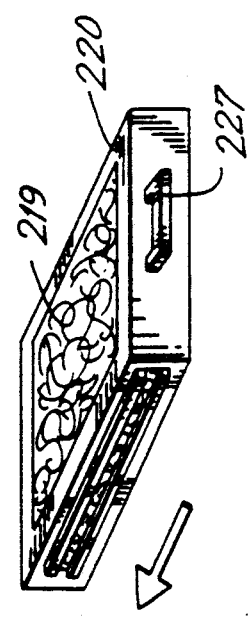
Figure 23:
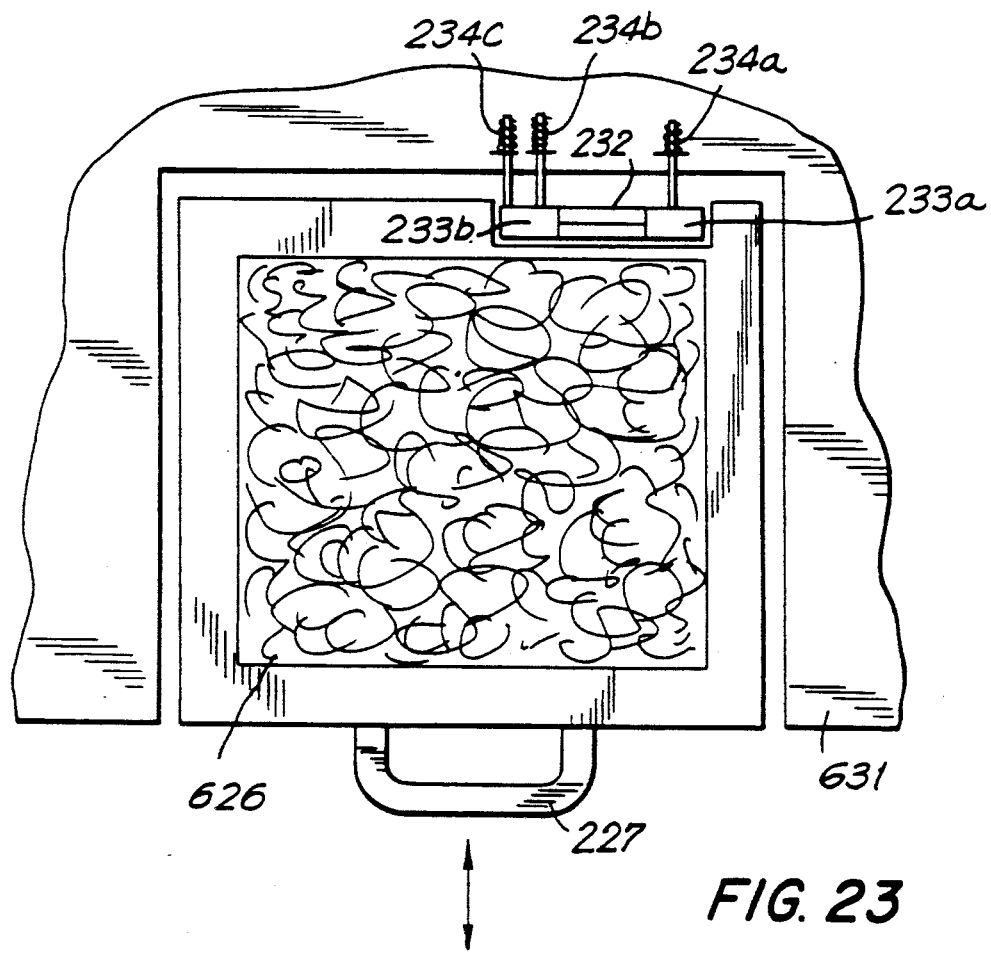
Figure 25:
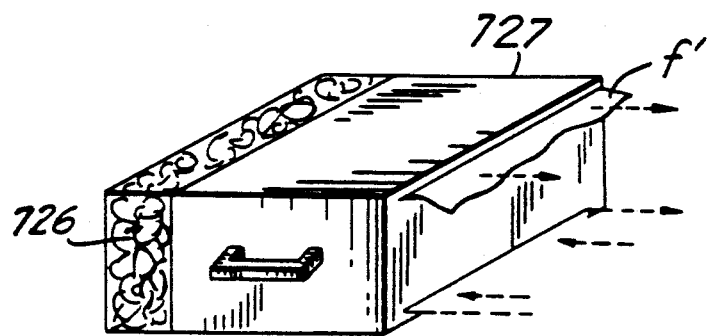
Figure 24:
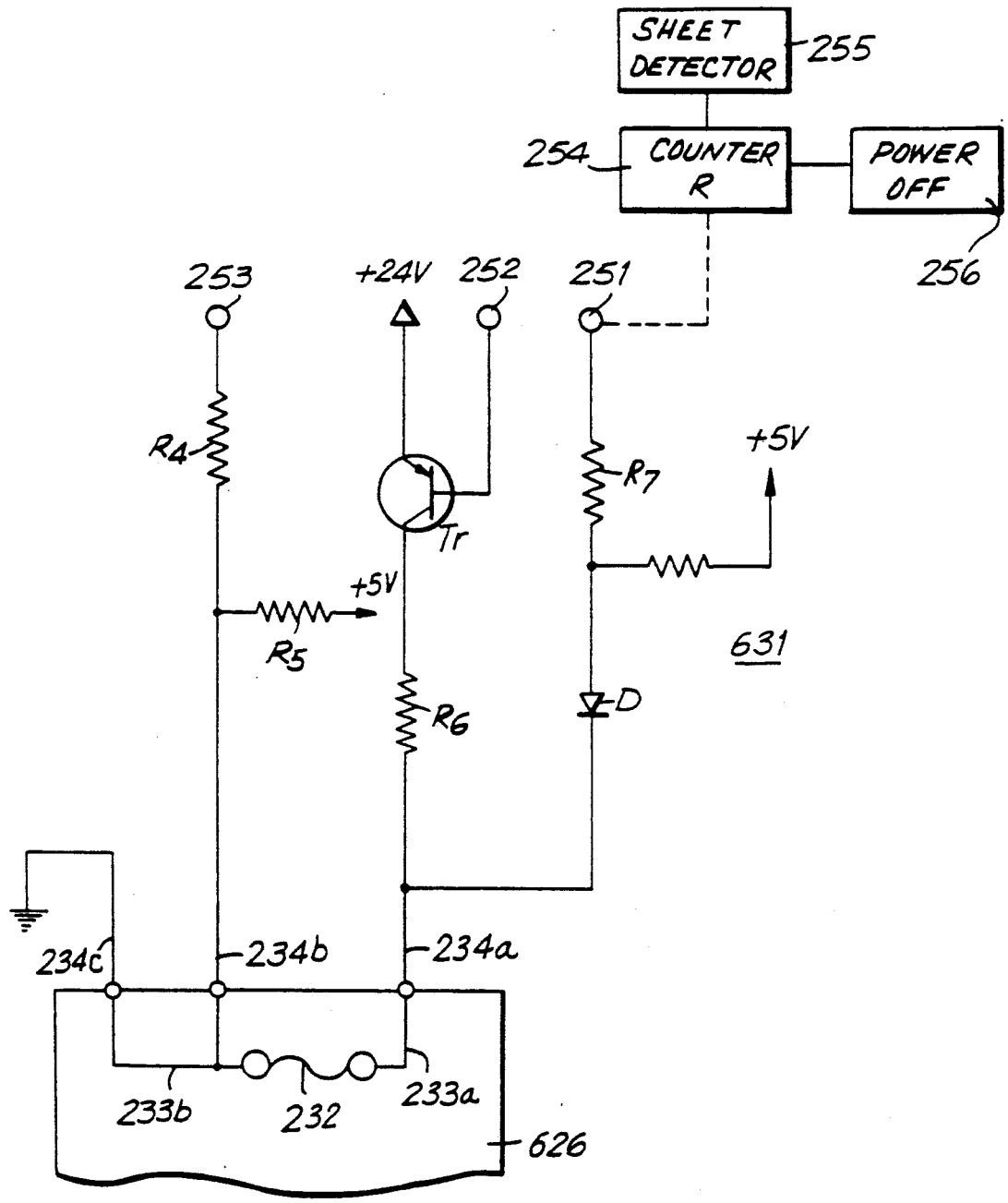
Figure 26:
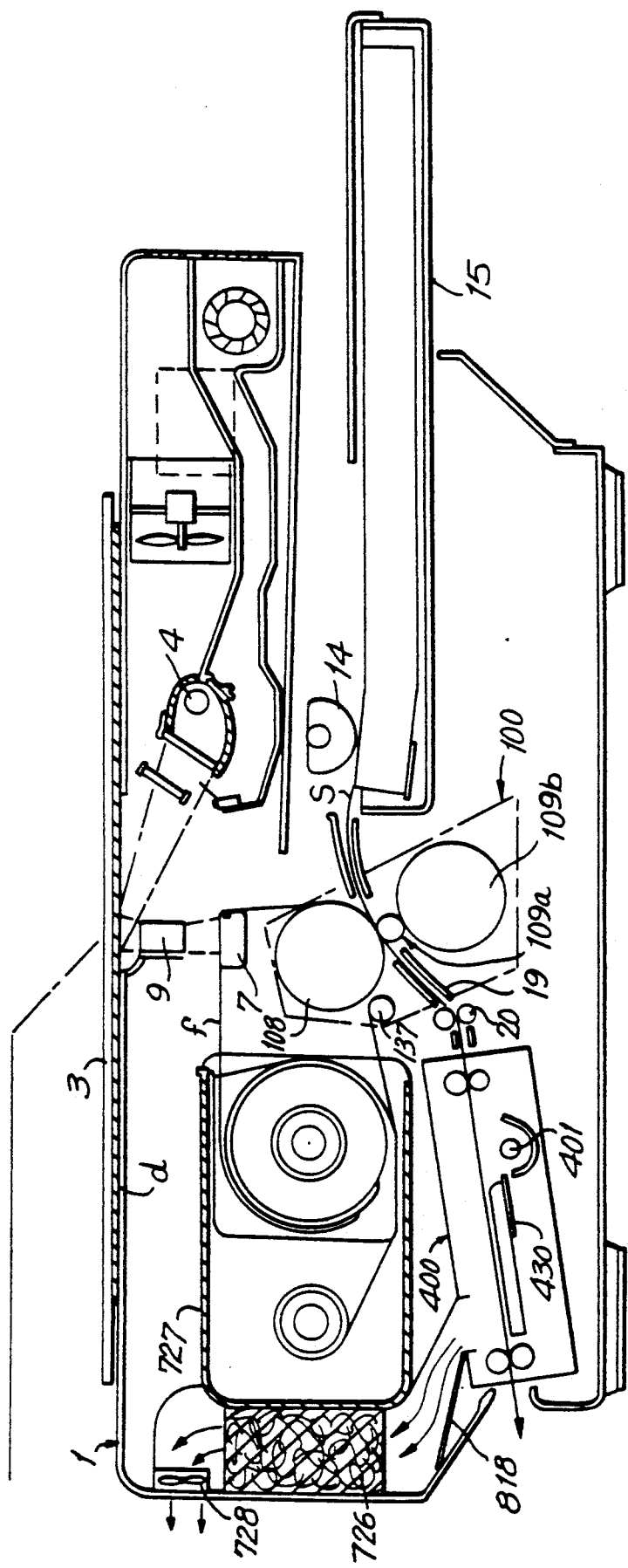

FIG. (12a)–12(c) are plan views of the device showing the sheet support wire, with the sheet at different positions;

FIG. 13 is a perspective view of a device for driving a shutter in which the power is ON;

FIG. 14(a) to (c) are plan views showing the relation between the position of shutter and the area irradiated at different portions of the shutter;

FIG. 15 is a perspective view of a device for driving a shutter in which the power is OFF;

FIG. 16 is a cross-sectional view of a heater producing radiation heat and a shutter;

FIG. 17 is a diagram of a circuit for energizing a keep solenoid;

FIG. 18 illustrates a gas-removing device;

FIG. 19 is a perspective view of a prefilter;

FIG. 20 illustrates a prefilter in accordance with a further embodiment of the invention;

FIG. 21 is a perspective view of a gas filter;

FIG. 22 is a cross-sectional view of a cover of a gas filter in accordance with another embodiment of the invention;

FIG. 23 illustrates an image forming device including a gas filter including an operating portion and a body including a size detecting portion;

FIG. 24 is a circuit diagram of a gas filter including an operating portion including a fuse;

FIG. 25 is a perspective view of a gas filter integral with a container holding a photosensitive member; and FIG. 26 is a cross-sectional view of an image forming device apparatus in accordance with another embodiment of the invention.

DETAILED DESCRIPTION OF THE PREFERRED EMBODIMENTS

Figure 1:
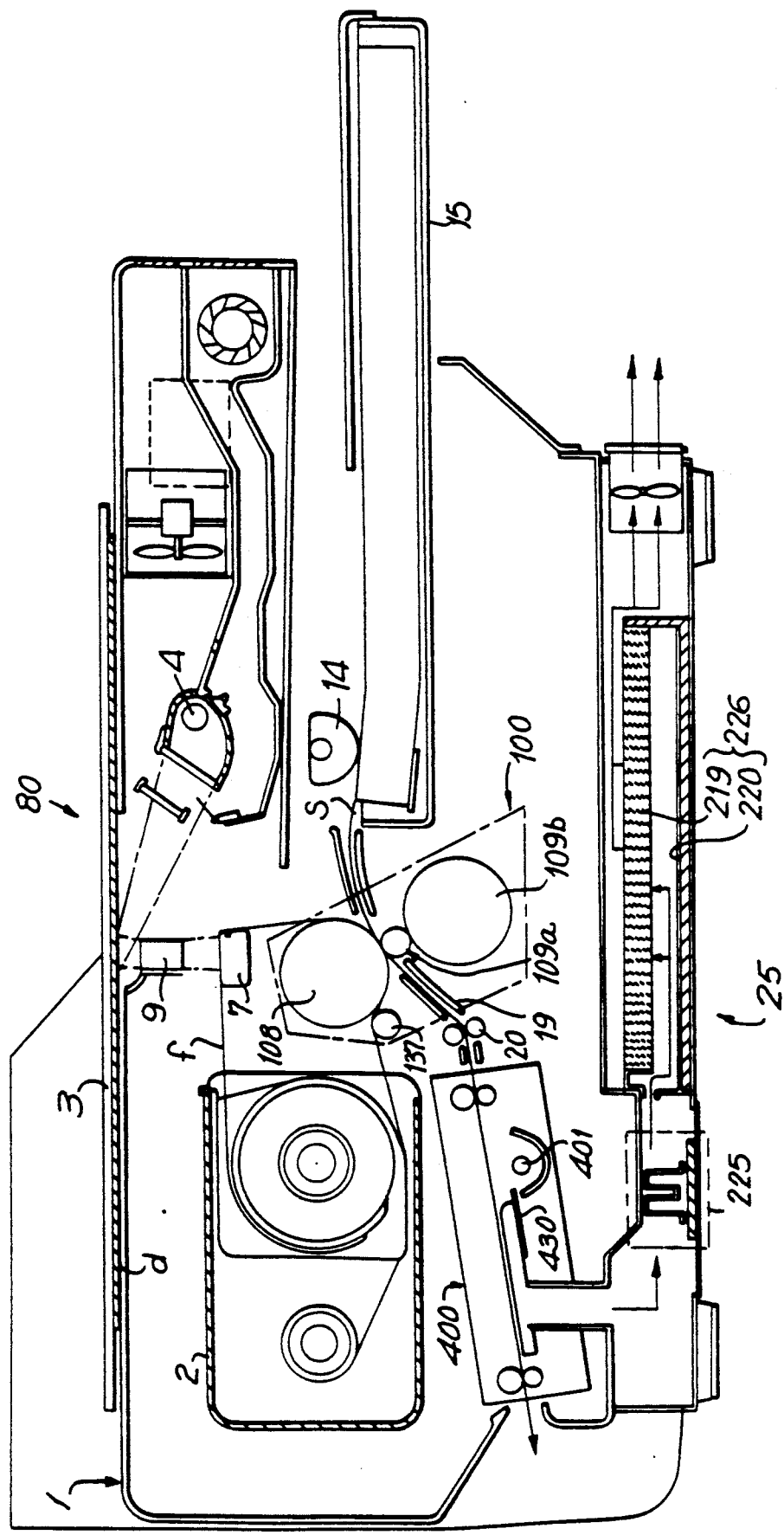
FIG. 1 is a cross-sectional view of an image forming device in accordance with the invention.

An image forming device in accordance with the invention is shown in cross section in FIG. 1. Image forming device 80 includes a body 1 and a container 2 holding a photosensitive member f within body 1. Photosensitive member f is a photosensitive film. Microcapsules containing liquid coloring preforms, i.e. cyan, magenta and yellow, which harden when exposed to red light, green light and blue light, respectively, are dispersed in photosensitive member f. A document carrier 3 carries a document d and moves it in the main scanning direction, i.e. from one end to the other end. The document is exposed to light emanating from an exposure lamp 4 and the surface of document carrier 3 is scanned. A self-focusing lens array 9 directs light reflected from document d onto an exposure table 7 and a latent image is formed on photosensitive member f and carried at the same velocity as document d.

Image forming device 80 includes a development device 100 for developing a photographic image under pressure which includes a pressure adjusting device. Pressure rollers 108, 109a and 109b are disposed inside development device 100 to apply pressure to exposed photosensitive member f and a sheet s on which a visible image is created. Sheet s is held in a cassette 15 and is moved by a carriage roller 14. Thus, photosensitive member f and sheet s are pressed against each other to break the microcapsules which lie on photosensitive member f and which do not harden during the exposure step. The liquid coloring preforms inside the broken micro capsules are transferred to sheet s. At the same time, the coloring preforms react with developer applied to sheet s to develop the colors.

A separation guide 137 is mounted on the exit side of development device 100. The developed photosensitive member f is guided by separation guide 137 and forced into container 2. After developing, sheet s passes between guide plates 19 and is next conveyed into a thermal treating device 400 by feed rollers 20. Thermal treating device 400 includes a heater 401 which heats sheet s to promote the development of the colors. Luster is also imparted to the surface of the image and sheet s is removed. Gas produced by thermal treating device 400 is removed by prefilter 225 and filter 226.

Development Device

FIG. 2 shows development device 100. Pressure roller 109a is supported on back up roller 109b to withstand large pressure. Back up roller 109b is rotated by a motor (not shown) in the direction indicated by the arrow. The diameter of pressure roller 109a is small to decrease the required pressure. Pressure roller 108 is supported on a support member 120, which is pivotally mounted on a pivot 121. Support member 120 is always biased upward by a weak spring 122 and positioned by a stopper 123.

A pressure roller driving device 118 includes a cam 124 directly coupled to a motor 113 and a lever 126 rotatably mounted about a pivot 125. When cam 124 is in position A, pressure rollers 108 and 109a are kept apart. One arm of lever 126 acts as a cam follower and rides on the surface of cam 124. When cam 124 is rotated into the position where region B of the surface of the cam is engaged by the cam follower arm of lever 126, roller driving device 118 brings pressure rollers 108 and 109a into contact with each other. A pressure spring 127 for determining the applied force includes an upper seat 128, a lower seat 129 supported on the arm of lever 126, a double headed pin 130 and a coil spring 131. Spring 127 is mounted on roller driving device 118. The respective heads of pin 130 are captured in spaces 128a and 129a defined in upper and lower seats 128 and 129 so that the pin defines the maximum and minimum spacing between the seats. Coil spring 131 is kept in compression. A force-adjusting device 132 includes an adjusting member 134, a pinion 135 and a motor 136. Adjusting member 134 includes a front adjusting portion 133a and a rear rack portion 133b. Front adjusting portion 133 engages an inclined camming surface 128b on upper seat 128 to permit operation of adjusting portion 133a intermediate seats 128 and the engagement portion 138 of support member 120 by adjustment of adjusting member 134 by the rack and pinion.

FIG. 2 shows the condition in which the pressure rollers are separated from each other. Photosensitive member f is wound around pressure roller 108, passes over the separation guide 137 and is wound up inside container 2. In this position, sheet s is supplied and superimposed on photosensitive member f. At this time, front adjusting portion 133 of member 134 can be inserted between upper seat 128 and seat 138 of support member 120 by motor 136. To increase the applied pressure front end portion 133 is inserted. However, front end portion 133 is usually not inserted.

When cam 124 rotates and moves from the position at which region A is engaged by the cam follower to the position at which region B is engaged by the cam follower, pressure spring 127 moves upward to engage engagement portion 138 of support member 120, pivoting the support member and pressing lower pressure roller 109a against upper pressure roller 108. The compressive force of pressure spring 127 pushes sheet s against photosensitive member f, resulting in photographic development. As rollers 108 and 109a rotate, the development progresses gradually. The applied force can be switched between two values by inserting or failing to insert front adjusting portion 133 of member 134, i.e. by moving the point at which pressure spring 127 acts either onto front adjusting portion 133 or onto engagement portion 138 of support member 120. When paper having different widths, for example, A4 and a sheet having a narrower width are used as sheet s, the applied force is not increased for the smaller size and is increased for the larger size paper during image development.

FIG. 3 shows the relationship between spring force and spring displacement for spring 127. Spring 127 is normally kept compressed. Cam 124 applies a force to spring 127 until it is displaced to portion $A_0$. Spring 127 exerts a force of $F_0$ in this state. When front adjusting portion 133 of member 134 is inserted, spring 127 is displaced the thickness of front adjusting portion 133. As a result, spring 127 is displaced to position A, and produces force $F_1$.

Figure 4:
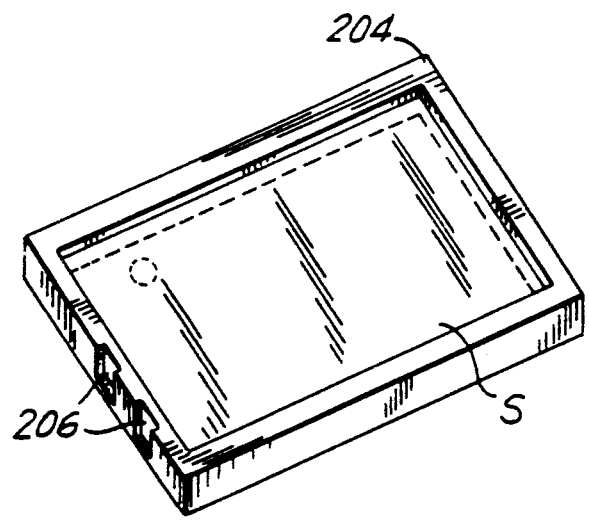
FIG. 4 is a perspective view of a container for holding paper on which visible images are created including a portion for detecting size.
Figure 5:
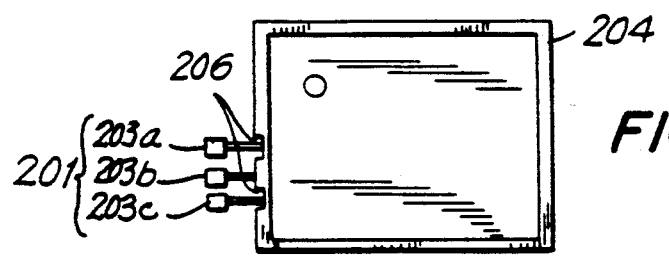
FIG. 5 is a top plan view of the container shown in FIG. 4.

It is advantageous to know the size of sheet s. The side surface of the container holding the sheet can be shaped to detect the size of sheet s. FIG. 4 is a perspective view of a sheet holding container including a size detecting portion. FIG. 5 is a plan view of container 204. Container 204 is installed in image creating device 80. Container 204 has a recesses 206 for receiving detecting sensors for detecting the size of sheet s. Detector 201 consists of three sensors 203a, 203b and 203c. Each of the sensors are microswitches having an ON position and an OFF position.

The three sensors can detect eight different conditions ($2 \times 2 \times 2$). If the condition in which all the sensors are in the OFF position corresponds to no container 204 in position, then seven different paper sizes can be detected. Container 204 has a portion in registration with microswitches 203a, 203b and 203c which can be notched in none, one or more of the three locatiions facing the microswitches. Where notched, the microswitch registers OFF, where there is no notch, the microswitch registers ON. Thus, in the example of FIGS. 4 and 5, notches 206 in registration with microswitches 203a and 203b are provided by assigning different paper sizes to different containers 204 having different notch configurations, detector 201 can detect many different paper sizes.

Referring again to FIG. 2, when the size of the sheet is detected, motor 136 is driven to optimize the pressure applied by developing device 100 in accordance with the size. In other words, development device 100 offers the best quality image depending on paper size.

Figure 6:
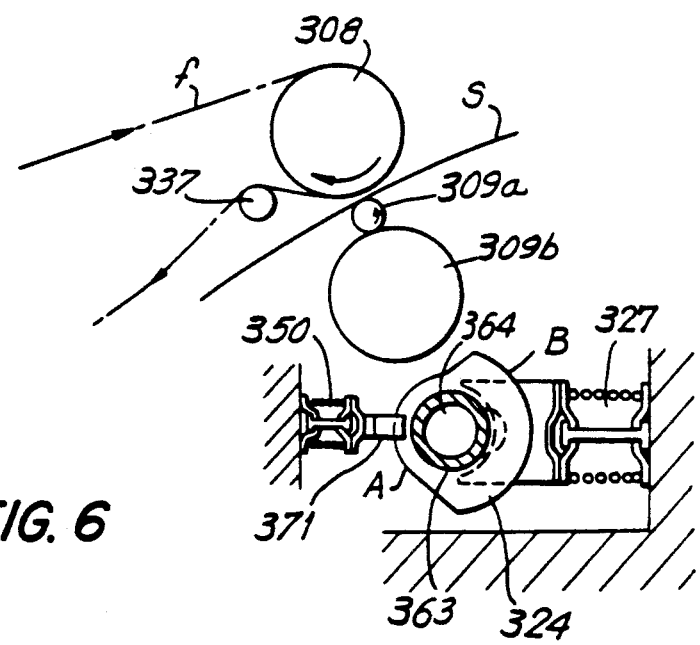
FIG. 6 illustrates a pressure-adjusting device of a development device in accordance with another embodiment of the invention.

FIG. 6 depicts a second embodiment of a development device 300. A cam 324 has a shaft 364 which is mounted on a bearing 363. As a motor (not shown) rotates, cam 324 rotates and its surface B bears against a back up roller 309, bringing pressure roller 309a into contact with a pressure roller 308. The compressive force of a pressure spring 327 presses sheet s against photosensitive member f resulting in photographic development.

The force applied to cam shaft 364 by a second pressure spring 350 is varied to change the force exerted between pressure rollers 308 and 309a. The force exerted between rollers 308 and 309a is determined by the difference between the forces applied to cam shaft 364 by spring 327 and spring 350, respectively.

Figure 7:
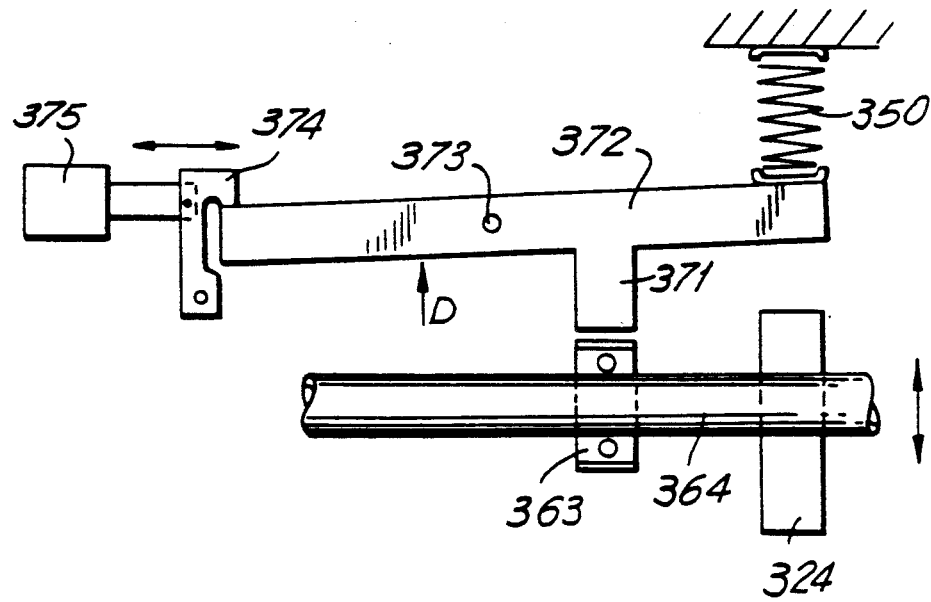
FIG. 7 is a side elevational view of the pressure-adjusting device shown in FIG. 6 in a first state.
Figure 8:
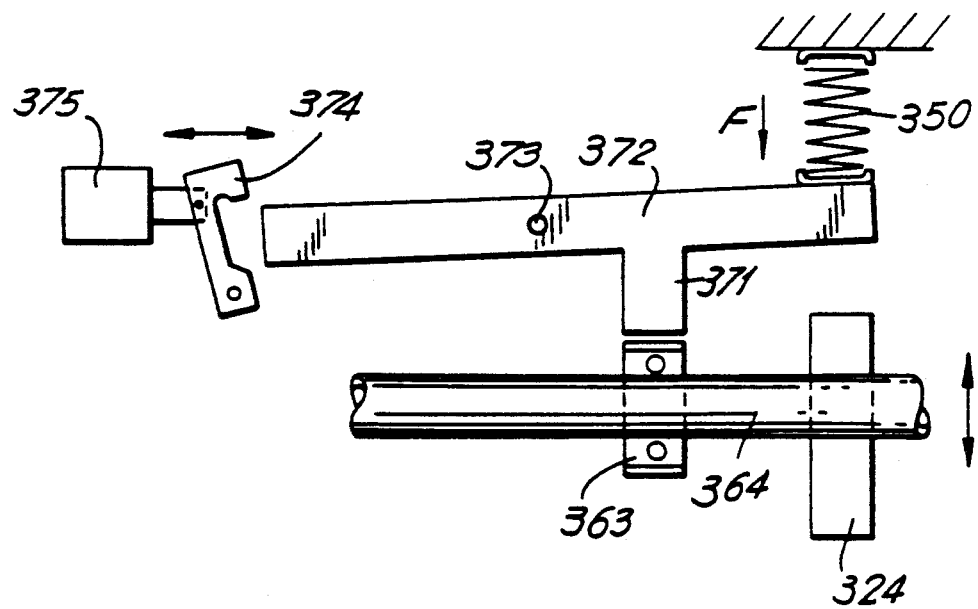
FIG. 8 is a side elevational view of the pressure-adjusting device shown in FIG. 6 in a second state.

FIGS. 7 and 8 illustrate a device for varying the force applied by second pressure spring 350 to cam shaft 364. FIG. 7 shows the condition in which second pressure spring 350 applies a small force to cam shaft 364. FIG. 8 shows the condition in which spring 350 exerts a large force on cam shaft 364.

In FIG. 7, a lever 372 engages a stopper 374. In this state, the force of second pressure spring 350 is not transmitted to cam shaft 364. Thus, pressure roller 309a is pressed by a large force of spring 327 against pressure roller 308.

In FIG. 8, an actuator 375 is energized to pivot stopper 374 out of engagement with lever 372. The force of pressure spring 350 is transmitted through pivotable lever 372 to a protrusion 371 forced thereon. Protrusion 371 presses against bearing 363 and the force of spring 350 is transmitted to cam shaft 364 to counteract part of the force of spring 327. Thus, roller 309a is pressed by a smaller force against roller 308.

When stopper 374 is driven, protrusion 371 bears on bearing 363, creating a gap between lever 372 and stopper 374. Since no force is applied to stopper 374, an actuator 375 consisting of a small solenoid or the like can sufficiently drive stopper 374. The applied force is easily switched between two values. Second pressure spring 350 can be used at a position lying in the direction indicated by arrow D of FIG. 7. In such a case, second pressure spring 350 would apply pressure to the other arm of lever 372 to rotate the lever about pivot 373. The force of spring 350 is transmitted by protrusion 371. It is possible to manufacture spring 350 small in size.

As shown in FIGS. 4 and 5, the container for holding the sheets on which visible images are created has a portion 206 for detecting the size of sheet S. By setting sheet holding container 204 in image creating device 80, the size of sheet s can be detected. Actuator 375 shown in FIGS. 7 and 8 is energized to drive stopper 174 and the pressure applied by development device 100 is varied. Thus, the development device provides a high quality image.

Thermal Treatino Device

Figure 9:
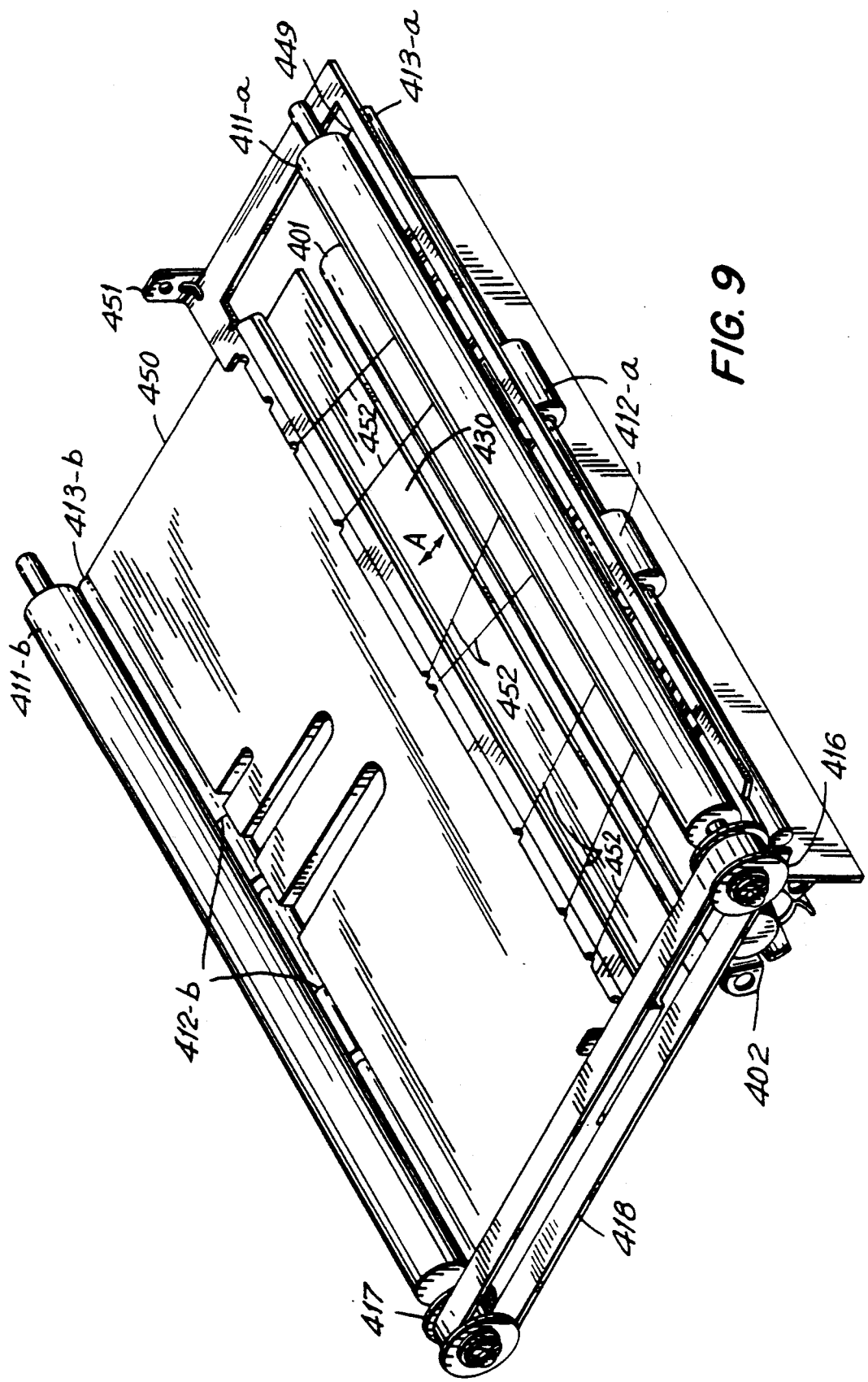
FIG. 9 is a perspective view of a thermal treating device in accordance with the invention.

FIG. 9 is a perspective view of thermal treating device 400. Thermal treating device 400 heats color former or developer placed on a sheet above its softening point and melts it to remove the irregularities of the surface. As a result, a lustrous and vivid image is obtained.

A rubber roller 411a is disposed near the entrance and includes a layer of silicone rubber mounted to a shaft made of free-cutting steel. Back up rollers 412a made of a polyacetal are mounted on a back up roller 413a, formed of free-cutting steel, by an E-shaped retaining ring. Back up rollers 412a are pressed against roller 411a by a spring (not shown). Similarly, a rubber roller 411b, back up rollers 412b and a back up roller shaft 413b are disposed on the exit side. A pulley 417 on the exit side is attached to rubber roller 411b by an E-shaped retaining ring and a spring pin (not shown). A pulley 416 on the entrance side is attached to rubber roller 411a by an E-shaped retaining ring and a The power is transmitted to pulley 416 by a timing belt 418. Pulley 416 rotates rubber roller 411a.

An entrance paper guide 449 formed of plated steel is mounted below rubber roller 411a on the entrance side. Guide 449 also guides sheet s to a wire 452 made of piano wire or stainless steel. Wire 452 supports sheet s. As shown in FIG. 9, wire 452 is supported by grooves formed in a wire guide 451. A paper guide 450 formed of a heat proof resin is disposed below wire guide 451, and guides sheet s until it reaches rubber roller 411b and back up roller 412b.

Mounted below paper guide 450 is a shutter 430 formed of cold-rolled steel plated with nickel. Shutter 430 acts as a heat insulating member and can be moved in the direction indicated by arrow A. A rod like ceramic heater 401 emitting far-infrared radiation and a reflector 402 are positioned below shutter 430. Reflector 402 is formed of an aluminum alloy or stainless steel.

Figure 10:
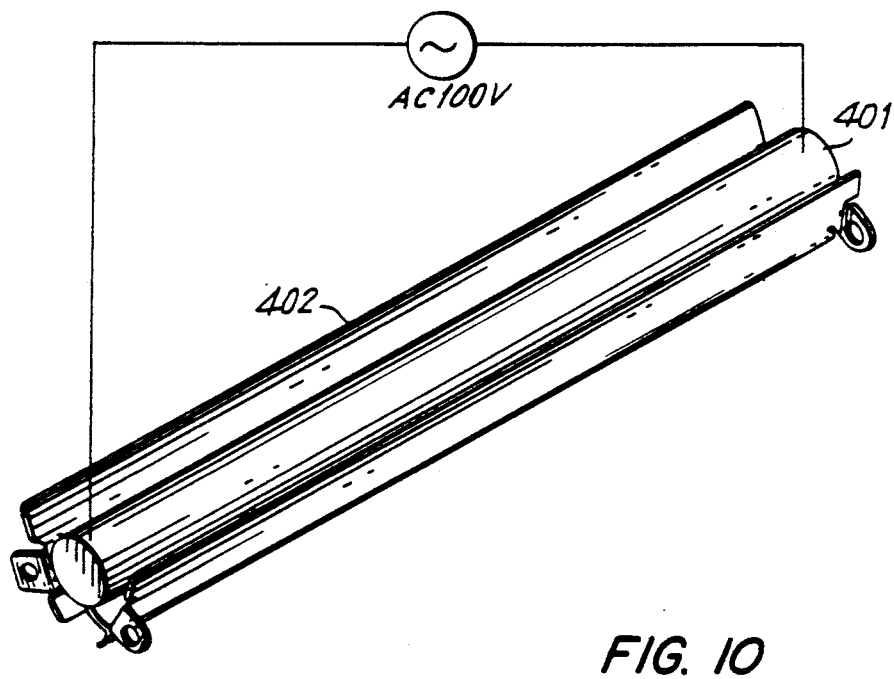
FIG. 10 is a perspective view of a heater for producing radiation heat and a reflector.

FIG. 10 illustrates the structure of heater 401 and reflector 402. Heater 401 is powered by 100 V AC. Heater 401 may also be a far-infrared heater formed of a quartz glass tube or a halogen heater.

Sheet s is heated in a non-contact manner by radiation heat. This is necessary since the heat melts the color formers and developers on the sheet. The image quality deteriorates if the melted color formers and developer come into contact with the image surface.

Figure 11:
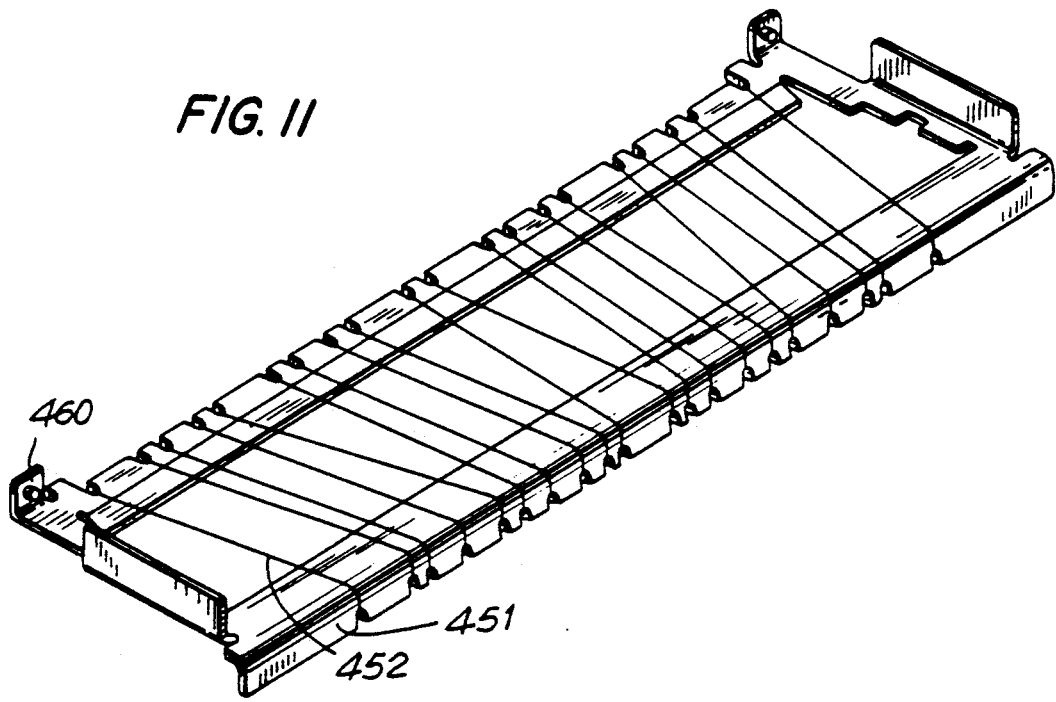
FIG. 11 is a perspective view of a guide member integral with a sheet support.

FIG. 11 is a perspective view of guide member 451 formed integrally with a sheet support formed of wire 452. Both ends of wire 452 are attached to wire guide 451 by a wire retainer 460, such as screws, formed integrally with guide 451. Wire 452 acts to guide sheet S. Thus, the support is easy to assemble as a unit, wire 452 is reliably secured and thermal treating device 400 is easily assembled. The sheet support can also be designed to be easily replaced.

Referring back to FIG. 9, sheet s develops under pressure, is conveyed onto entrance paper guide 449 and moved onto wire 452 by rubber roller 411a and back up roller 412a. Rubber roller 411a is preferably silicone rubber. Wire 452 is oriented so that it is not parallel to the direction of movement of sheet S.

Figure 12:
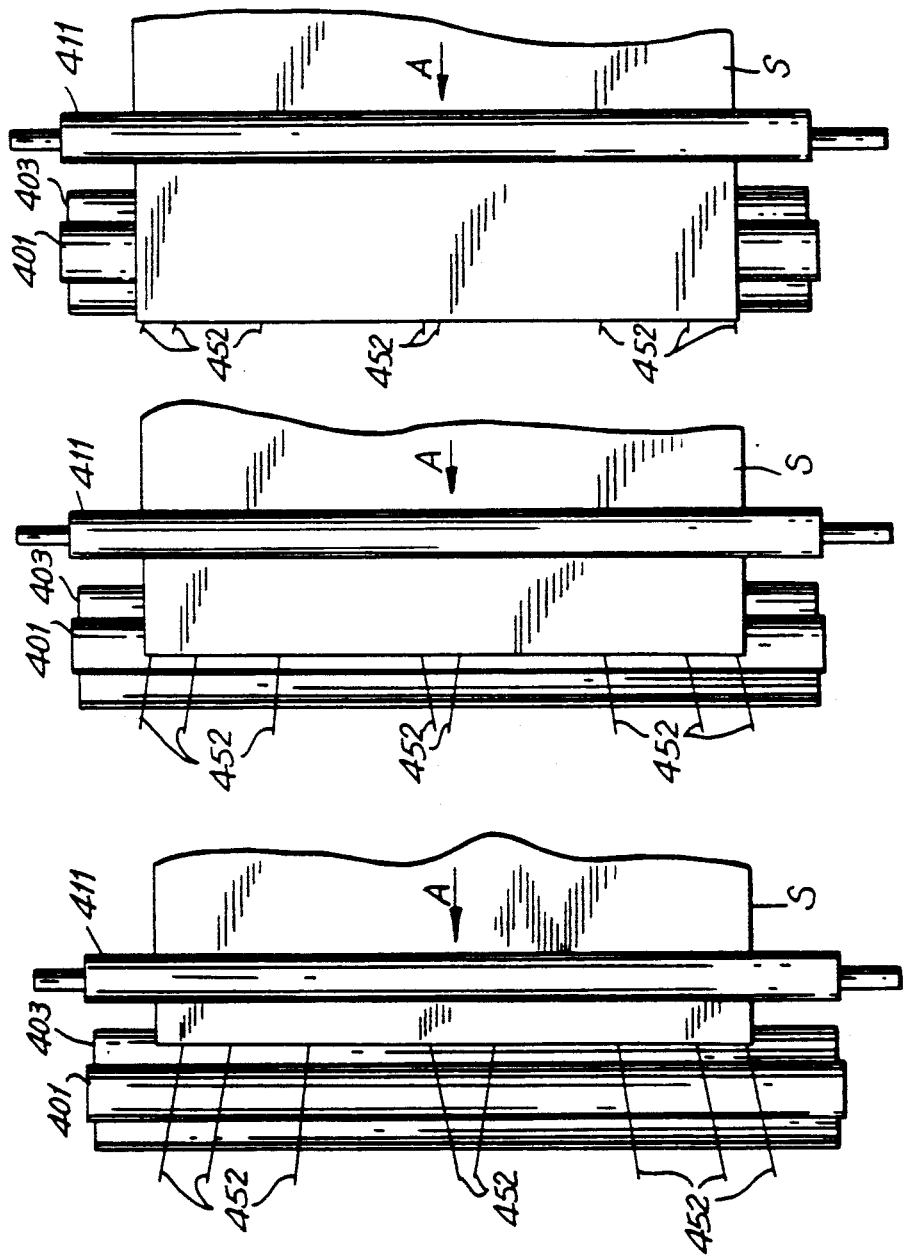

FIG. 12 illustrates the direction wire 452 is stretched. Sheet s is transported in the direction indicated by arrow A, shown in FIGS. 12(A), 12(B) and 12(C). The direction in which wire 452 extends is not parallel to the direction of movement of sheet s for several reasons. First, sheet s is heated by radiation heat from heater 401 from below sheet S. If wire 452 is parallel to the direction of movement of sheet S, shadows of wire 452 are created, resulting in non-uniform luster. Second, sheets becomes less rigid and both ends of the sheet drop when the sheet is heated. As a result, the paper tends to jam. When wire 452 is stretched as shown in FIGS. 12(A)-12(C), both ends of sheet s are supported. Thus, the possibility of a paper jam is reduced.

With the thermal treating device in accordance with the invention, no shadows of wire 452 are produced. Thus, a vivid image with uniform luster is obtained. Sheet s is heated from below, i.e. from the underside of the image surface, to obtain luster independent of the hues on the image surface.

Figure 14:
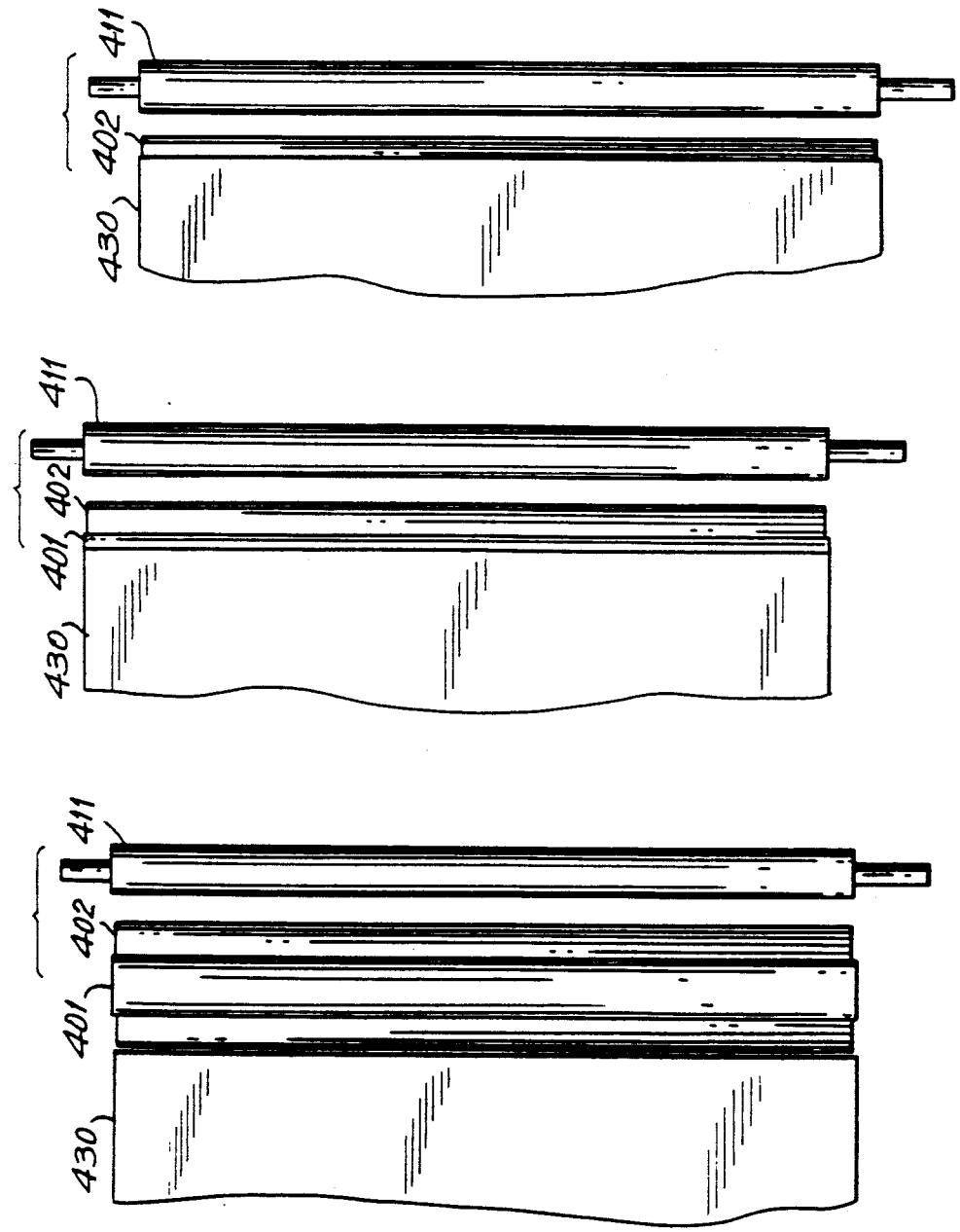

FIG. 13 is a perspective view of a device 480 for driving shutter 430. In FIG. 14 the power is ON. A rack 433, preferably of brass, is screwed to the underside of shutter 430. A gear 434 including thirty-four teeth and formed of a heat proof resin is engaged with rack 433. Preferably, polyphenylene sulfide is used as the heat proof resin. A gear 435b including nineteen teeth is engaged with gear 434. Gear 435b is engaged with a gear 436b having seventy-nine teeth. Preferably, gears 435b and 436b are formed of polyphenylene sulfide resin in the same manner as gear 434.

A gear 435a is engaged with gear 436b. Gears 435a and 436a are similar to gears 435b and 436b, respectively. A gear 437 having fifty-five teeth and formed of a heat proof resin is engaged with gear 436a. A gear 438 having twenty nine teeth is engaged with gear 437. A pinion 440 having seventeen teeth and fitted in step motor 439 is engaged with gear 438. Thus, the number of revolutions made by motor 439 is reduced by a factor of about thirty five, and gear 434 is rotated. Rack 433 is driven and moves shutter 430 into the desired position in the direction indicated by arrow A or arrow B of FIG. 13.

FIGS. 14(A)–14(C) show the relationship of the position of shutter 430 to the size of the portion illuminated (indicated by hatching). When an image having the greatest glossiness is desired, the shutter is moved into the position shown in FIG. 14(A). This maximizes is the amount of heat applied to sheet S. When a medium glossiness is desired, shutter 430 is moved to decrease the area of the portion illuminated as shown in FIG. 14(B). When an image having low glossiness is desired, shutter 430 is positioned as shown in FIG. 14(C) to reduce the area of the illuminated portion even further. Thus, an image having the desired glossiness is obtained by moving shutter 430.

Lustrous images exhibit various degrees of luster. Glossiness is a measure of the degree of luster. Generally, the glossiness of paper-like substances are measured in terms of 75° glossiness. No one degree of glossiness is ideal. Ideal glossiness changes, depending on taste. For example, some people like images of more than 90 in terms of 75° glossiness, such as ordinary photographs. Other people like lusterless images of the order of 50 in terms of 75° glossiness. Still others like image of about 70, such as general posters. Accordingly, the ideal thermal treating device of the novel image-creating apparatus is capable of varying glossiness according to taste.

If the velocity at which the sheet is conveyed is varied between 5 mm/s, 7 mm/s, 9 mm/s, 11 mm/s, 13 mm/s, 15 mm/s, and 17 mm/s, and the position of the shutter is changed relative to the change in the conveyance velocity, glossiness values between 50 and 90 can be obtained. Higher glossiness values are obtained when the shutter opens more fully.

Spiral springs 445a and 445b are mounted to shutter 430 on opposite sides to apply a force at all times in the direction indicated by arrow B. The force with which shutter 430 is pulled by springs 445a and 445b in the direction of arrow B is larger than the frictional force shutter 430 encounters. If shutter 430 is always pulled in the direction indicated by arrow B, shutter 430 does not move since stepper motor 439 produces friction when it is at rest. Shutter 430 can be moved into an arbitrary position and retained in that position by motor 439. Spiral springs 445a and 445b move shutter 430 at a constant rate without regard to the position 430. If general coiled springs are employed, however, shutter 430 is not moved at a constant rate.

Gears 437 and 438 are mounted on shafts by E-shaped retaining rings (not shown). The shafts are crimped against a lever 441 formed of plated steel the lever being pivotably mounted about the shaft for gear 438. Thus, gear 437 can rotate around gear 438, i.e. gear 437 acts as a planetary gear. A coiled spring 442 is mounted to lever 441. A solenoid 444 is coupled to lever 441 by a pin 443. Solenoid 444 may be either a normal solenoid or a keep solenoid.

In one embodiment solenoid 444 is a normal solenoid. FIG. 15 is a perspective view of device 480 for driving shutter 430 in which the power is OFF. In this state, solenoid 444 produces no attractive force and coiled spring 442 pulls lever 441 in the direction indicated by arrow C. Lever 441 and gear 437 revolve around gear 438, and gear 437 is separated from gear 436a. As a result, the frictional force of motor 439 which is at rest cannot hold shutter 430. Thus, spiral springs 445a and 445b pull shutter 430 in the direction indicated by arrow B and shutter 430 is closed.

When the power is turned on, DC 24 V is applied to solenoid 444 and solenoid 444 is energized. If solenoid 444 is a normal solenoid, solenoid 444 attracts lever 441 in the direction indicated by the arrow D and lever 441 is moved. The movement of lever 441 energizes gear 436a, and the condition shown in FIG. 13 is obtained. If DC 24 V is continuously applied to the solenoid 444, solenoid 444 will overheat. Preferably, DC 24 V is applied for 0.2 seconds, and then only DC 5 V is applied to solenoid 444. Once solenoid 444 attracts lever 441 only DC 5 V is necessary to bring gear 437 into engagement with gear 436a. Shutter 430 is then placed in a desired position by motor 439.

In FIG. 13, if the power is turned off, solenoid 444, which is a normal solenoid, does not produce an attractive force. Coiled spring 442 pulls lever 441 in the direction indicated by arrow C. Gear 437 is moved apart from gear 436A as shown in FIG. 15. In FIG. 15, the static friction of stepper motor 439 is incapable of holding shutter 430 at rest. Spiral springs 445A and 445B attract shutter 430 in the direction indicated by arrow B and shutter 430 is closed.

FIG. 16 is a cross sectional view illustrating the positional relationship between heater 401 and shutter 430. Shutter 430 also acts as a heat insulating member. If the power is turned off while heater 401 is heating sheets, shutter 430 is inserted between heater 401 and the sheet and shutter 430 stops heat from flowing from heater 401 to sheet s. Thus, it is unlikely that sheet s will overheat, become scorched or suffer any adverse affects from the heat.

In a second embodiment, solenoid 444 is a keep solenoid. In FIG. 15, if the power is turned on, and 24 V DC is applied to solenoid 444 for 0.24 seconds, solenoid 444 is energized. Solenoid 444 attracts lever 441 to bring gear 437 integral with gear 436a, as shown in FIG. 13. Since solenoid 244 is a keep solenoid, after 24 V DC is applied for 0.24 seconds, gear 437 is maintained integrally with gear 436A without applying additional voltage to solenoid 444 since solenoid 444. When the power is turned on, electric charge is stored in a capacitor.

When the power is turned off, the electric charge is released from the capacitor to apply a voltage to solenoid 444 in a direction opposite the direction of the voltage applied when the power is turned on. Coiled spring 442 pulls lever 441 in the direction indication by arrow C moving gear 437 away from gear 436A as shown in FIG. 15. Spiral springs 445A and 445B close shutter 430.

FIG. 17 shows a circuit for energizing a keep solenoid. A switch SW is closed for 0.2 second after the power is turned on. The gate of transistor T, is actuated through resistor R, causing electric current to flow through the source and drain path of transistor T, and diode D in the direction indicated by arrow E. Electric charge is then stored in a capacitor C. If the power is turned off, current stops flowing through transistor $T_2$ and resistor $R_2$ to ground, opening transistor $T_3$. Electric charge is released from the capacitor C, the electric current flowing in the direction indicated by arrow F through transistor $T_3$ to ground. The base of transistor $T_2$ is connected to ground through resistor $R_3$ while the base of transistor $T_3$ is connected to resistor $R_2$.

Gas Removing Device

During image processing, irritating gases are produced. These irritating gases make the operator of the image performing device uncomfortable, particularly when the image forming device is used in a closed room for a long time period. The main components of the gas are formaldehyde, octylphenol and gaseous substances produced by heating acrylate organic compounds, having high boiling points, contained in the photosensitive material.

FIG. 18 illustrates a gas removing device 25 and its vicinity. Thermal treating device 400 includes a gas retainer 407 having an entrance slit opening 408 and an exit slit opening 409 for the passage of the sheets. Gas generated inside thermal treating device 400 is drawn into an exhaust duct 222 through a guide duct 218 by an exhaust fan 221. Exhaust duct 222 is mounted in the lower portion of thermal treating device 400. The gases are adsorbed on a prefilter 225 and on an absorber 219 which are mounted inside exhaust duct 222. Prefilter 225 includes an auxiliary adsorbing portion 223 and an absorbing member 224.

Auxiliary adsorbing portion 223 of prefilter 225, disposed on the upstream side of the absorber 219 is a punched metal sheet. As the gaseous components pass over auxiliary adsorbing portion 223, gaseous components of higher boiling points are cooled and produce oily substances which adhere to auxiliary adsorbing portion 223. As the amount of oily substances increases, they become liquid, drip, and are absorbed by absorbing member 224 disposed between the auxiliary adsorbing portion 223. Absorbing member 224 is preferably felt.

Gas passed through prefilter 225 is forced into gas filter 226 and absorbed on absorber 219 including activated carbon or the like. FIG. 19 depicts prefilter 225. The punched metal sheet is bent to form auxiliary adsorbing 223. Felt attached to the underside of the punched metal sheet is used to form absorbing member 224. The felt prevents the oily matter, which adheres to auxiliary adsorbing portion 223 inside gas exhaust 222 from dripping and flowing out. In the present embodiment, the punched metal sheet is bent to form auxiliary adsorbing portion 223. However, the punched metal sheet can be bent arbitrarily. It is also possible to form auxiliary adsorbing portion 223 from paper, plastic, cloth, ceramic, glass or another material. Additionally, absorbing member 224 may be formed of paper, sponge, cloth or other material instead of felt.

FIG. 20 illustrates a second embodiment of a prefilter. Prefilter 225', in the form of a pad, is disposed inside a gas exhaust duct 222' on the upstream side of an absorber 219'. In this embodiment, prefilter 225' also functions as the auxiliary adsorbing portion and the absorbing member. Prefilter 225' may also be formed of unwoven fabric, sponge, chemical fibers, steel fibers, porous paper or cloth, so that the resistance to gas is such that the flow velocity inside gas exhaust duct 222' is maintained constant, and the area of contact with gas is large.

Absorber 219' is preferably activated carbon or the like. Since absorber 219' has a limited life, whenever a predetermined number of sheets of paper are printed, absorber 219' must be replaced.

FIG. 21 is a perspective view of gas filter 226. Filter 226 is in the form of a cassette in which absorber 219 is formed integrally with a cover 220 having a bottom plate. Filter 226 is inserted in body 1 of image forming device 8 in the direction indicated by the arrow. Gas filter 226 is retained in body 1 by a gas filter retainer 228 mounted in body 1. Filter 226 can be withdrawn from body 1 by pulling a handle 227 in a direction opposite the direction indicated by the arrow. Thus, gas filter 226 is easily and safely replaced from outside device 80.

The gaseous components which have high boiling points and are not absorbed on prefilter 226 adheres oily matter to the entrance of absorber 219 and to the bottom plate of cover 220 since cover 220 is mounted on gas filter 226. Cover 220 is mounted on absorber 219 to keep the hands of the operator clean during the replacement of absorber 219. Additionally, cover 220 prevents the lower portion of device 80 from becoming dirty from adhesion of the oily matter.

FIG. 22 illustrates an alternate embodiment of a cover which encloses the entire absorber. In this embodiment, air containing the gaseous components produced inside image forming device 80, enters absorber 639 enclosed in cover 640 from one side of absorber 639 and leaves it from the other side surface. The gaseous components of the oily matter, including the liquid acrylate organic compounds of high viscosity, adhere to the entrance side surface of absorber 639. The operator replaces the filter without viewing absorber 639 since the entire absorber is enclosed in cover 639. Also within cover 640 is a device for monitoring the condition of the gas filter to ensure that the user can replace the gas filter safely.

FIG. 23 illustrates a third embodiment of a gas filter including a fuse in an operating portion. A filter 626 can be installed in a body 631 by sliding gas filter 626 in the direction indicated by the arrow. A fuse 232 having a glass tube is disposed behind filter 626. Three contact springs 234a, 234b and 234c are disposed at the joint between body 231 and fuse 232 to electrically connect contacts 233a and 233b of fuse 232. A first contact spring 234a contacts contact 233a of fuse 232. Second and third contact springs 234b and 234c, respectively, contact 233b of fuse 232.

FIG. 24 is a circuit diagram for the gas filter depicted in FIG. 23. Gas filter 626 in body 631 is detected in the following manner. When filter 626 is placed in position, contact 233b of fuse 232 installed on filter 626 contacts 234b and 234c of body 231 and an electrical short circuit takes place. The voltage on a setting detection portion 253 in body 231 drops from 5 to 0 V. As a result, the installation of filter 226 is detected. Specifically, contact 243c is connected to ground while contact 234b is connected to the junction of resistors $R_4$ and $R_5$. Resistor $R_5$ is connected to 5 V source while Resistor $R_4$ is connected to setting detection portion 253.

When gas filter 226 is placed in position, a determination is made whether gas filter 226 is new or old by determining whether fuse 232 is connected or melted. If filter 226 is new, fuse 232 is connected in the circuit and contacts 234a and 234c are short circuited The voltage at a sensing portion 251 is 0 V. This indicates that the filter 226 is new.

If filter 226 is new, a transistor $T_r$ when activated by a gate signal at terminal 252, in response to sensing portion 251 detecting a new filter conducts current through resistor $R_6$ to ground, causing a large current to flow through fuse 232. As a result, fuse 232 is melted. Contact 234a of fuse 232 is disconnected electrically from contact 233b. The voltage at sensing portion 251 increases to 5 V which indicates that gas filter 626 is old. Specifically, when a new filter is inserted, sensing portion 251 is connected to ground through resistor $R_6$, diode D' and fuse 232. When fuse 232 is melted, the sensing portion 251 is connected to a 5 volt source through resistors $R_6$ and $R_7$.

When it is determined gas filter 226 is new, a paper counter 254 incorporated in body 231 is reset simultaneously with the melting of fuse 232. The counter begins to count from 0 in response to sheet detector 255. The counting operation is continued until a predetermined number of sheets of paper used is reached, at which time counter 254 sends a signal to power off lever 256 and image forming device 80 does not operate even though the operator depresses the copy button.

The counter is reset by placing a new gas filter in position. The image forming device will then make copies. Thus, the image forming device is able to make copies only when gas filter 226 is placed in position and when the number reached by the counter is less than the predetermined number. Thus, safety is assured.

FIG. 25 illustrates an embodiment of a gas filter in which the photosensitive container is integral with the gas filter. The life of gas filter 726 is designed to be identical with the life of photosensitive member f' Thus, both parts can be replaced at one time. Additionally, it is not necessary to install a detector for measuring the condition of gas filter 726. When photosensitive member f' is used up, the duplication operation is automatically ceased. Consequently, gas filter 726 must be replaced.

Gas filter 726 can be attached with screws or adhesive. In the embodiment depicted, gas filter 726 is disposed along a container 727 holding photosensitive member f'. Gas filter 726 may also be mounted above, below, in front, or behind container 727.

FIG. 26 is a cross sectional view of an image forming device including a container holding a photosensitive member integral with a gas filter. Exhaust fan 728 forces the gas produced in thermal treating device 400 into gas filter 726 through guide duct 818. Gas filter 726 includes an adsorbing material including activated carbon. When air containing the gas passes through gas filter 726, the gaseous components are adsorbed on gas filter 726. Filter 726 can be located either in front of exhaust fan 728 or behind exhaust fan 728. Thus, purified air is emitted from image forming device 80.

In summary, in one embodiment of the invention, the image forming device includes a radiation heater and a movable heat-insulating member mounted between the heater and the sheet on which the visible image is created. An image of a desired glossiness according to taste can be obtained by varying the position of the heat-insulating member and conveyance speed of the sheet.

In another embodiment of the invention, a sheet support is joined of wires extending in a direction which is not parallel to the direction of movement of the sheet, between the heater and the sheet. Good conveyance of the sheet is thus assured. By this structure, a vivid image is obtained without producing nonuniform glossiness The thermal treating device of the image-forming device can be assembled as a unit resulting in an efficient manufacturing operation which involves fewer steps than are conventionally required. In addition, the device can be accurately assembled and the wire forming the sheet support can be reliably fixed. Finally, the thermal treating device is easily replaced.

The image forming device of the invention also includes a radiation heater and a heat-insulating member. When the power is cut off, heat from the heater is blocked by insertion of the heat-insulating member intermediate the heater and sheet. Thus, while the sheet is being heated, if the operator turns off the power, if the breaker opens, or if a blackout takes place, the sheet on which the visible image is created does not overheat and is not scorched. It is also unlikely that the sheet is deformed or decomposed by the heat. Finally, the apparatus is safe because poisonous gases are not emitted.

Image quality is not adversely affected by the size, the thickness, the quality or the surface roughness of the paper, the state of the photosensitive member, or environmental conditions. When the width of the paper is changed, e.g., to A3 or A4, or when the material is varied, e.g., from ordinary paper to OHP paper or vice versa, the development pressure is changed. This prevents image quality from deteriorating and paper jams and creases can be avoided.

Irritating gas produced during image formation is also efficiently removed, preventing the operator from becoming uncomfortable. The lower portion of the apparatus is used principally for removal of the gas. Thus, it is not necessary to mount a complex exhaust duct inside the device. Consequently, it is easy to make the device small in size. A gas filter in the form of a cassette is inserted into the body of the apparatus and is easily removed. When the operator changes the gas filter, he does not have to touch the inside of the device. Thus, the gas filter can be safely and easily installed and withdrawn.

In another embodiment of the invention, the gas removing means includes a removable filter with an operating portion for indicating the condition of the gas filter. The body of the image forming device is equipped with a device for detecting the operating portion of the gas filter which senses whether the gas filter is new or old. The image forming device also includes a paper counter for counting a predetermined number of sheets used. The image forming device will not operate after a predetermined number of sheets are printed unless a new gas filter is installed in the body of the image forming device.

If the gas filter is withdrawn from the image forming device before the predetermined number of sheets are printed and the gas filter is reinserted, the counter is not reset and continues to count. However, if the gas filter is replaced by a new gas filter before the predetermined number is reached, the total count is reset to zero. The new gas filter is employed until the predetermined number is reached. Thus, the gas filter cannot be used for forming images on more than the predetermined number of sheets of paper. This results in increased safety for the operator.

If the cover of the gas filter is attached to the adsorbent, the operator can replace the cover and adsorbent together when the adsorbent requires replacement Thus, the oily matter which adheres to adsorbent does not come in contact with the operator's hands and the operator remains clean. The cover includes a lever to facilitate replacement. If the oily matter which adheres to the adsorbent drips, the cover keeps the body of the image forming device clean.

Gaseous components having high boiling points and high viscosity can be condensed into dew and adsorbed on the bottom of the cover. Accordingly, the size of the adsorbent can be reduced or the adsorbent can be made from a cheaper material, contributing to a reduction in both the cost and the size of the gas filter.

Within the duct for discharging gas, an auxiliary adsorption portion and an absorbing member are disposed on the upstream side of the gas filter. The gas filter incorporates an adsorbent such as activated carbon or the like. The prefilter prevents the duct from becoming clogged by the adsorbent. Additionally, the lifetime of the adsorbent is increased. The structure makes it unlikely that oily matter adheres to the inner wall of the discharging duct, flows through the apparatus as liquid, and adheres to the output paper. Oily matter is also prevented from leaking out of the apparatus. Thus, the operator is prevented from touching the gaseous component. Where the auxiliary adsorption portion and adsorbing member are made from an incorruptible and unconsumed material such as a metal plate, plastic, felt, or nonwoven fabric, it is unnecessary to replace the filter. As described thus far, the image forming device in accordance with the invention is economical and safe.

Conventionally, three parts of an image forming device would require replacement: the container holding the photosensitive member, the sheet on which the visible image is formed and the gas removing device including the gas filter. In one embodiment of the invention, the gas-removing device and the container holding the photosensitive member are combined to form one unit. Thus, only two parts need to be replaced. This saves labor costs.

After the photosensitive member is completely used, the container holding the photosensitive member is replaced. This automatically replaces the gas filter. For this reason, the life of the gas filter is keyed to the number of sheets of paper the photosensitive member copies. When the gas filter and the container holding the photosensitive member are not one unit, it is necessary to extend the life of the gas filter to avoid frequent replacement. However, when the gas filter and the container for the photosensitive member are one unit, it is possible to minimize the size of the unit because there is no need to lengthen the life of the gas filter. In addition, due to the unitary structure, the number of parts can be reduced, thus reducing the cost.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An image forming device including a photosensitive member including a plurality of microcapsules in its surface, each of the microcapsules containing at least a color former and a photosensitive material, the photosensitive member being superimposed on a sheet on which a visible image is to be created before or after the member is exposed to an optical image, the photosensitive member being subjected to pressure after exposure and while the sheet is developed, and the image is fixed, said device comprising:

a container for holding the photosensitive member;
an exposure means which exposes the photosensitive member to the optical image;
means for holding the sheet;
development means for superimposing the photosensitive member on the sheet and developing the sheet under pressure and including at least one pressure roller, the development means including pressure-adjusting means for adjusting the pressure applied by the at least one roller;
said pressure-adjusting means including a pressure spring positioned to apply pressure to the at least one roller and spring adjusting means for selectively adjusting the amount of pressure applied by said pressure spring when said roller is in said pressure application position;
said spring adjusting means including means for selectively adjusting the amount of compression of the pressure spring;
said pressure roller displacing means includes pivotable first lever means supporting at one side of the pivot thereof said at least one pressure roller and having at the other side thereof a spring seat; displaceable cam means and cam follower means engaging said cam means and supporting said pressure spring for displacement of the pressure spring into and out of cooperative relation with the spring seat to displace the pressure roller in response to the displacement of the cam means.

2. The image forming device of claim 1, and including bias spring means for normally biasing the pivotable first lever means to the pressure rollers no pressure position.

3. The image forming device of claim 1, wherein the cam means is rotatably displaceable and the cam follower means includes a second pivotable lever means supporting a cam follower at one side of the pivot thereof and the pressure spring at the other side of the pivot.

4. The image forming device of claim 1, wherein the spring adjusting means includes an adjusting member and means for displacing the adjusting member between at least a first position, at which the pressure spring applies its pressure to the spring seat through the adjusting member to increase the compression of the pressure spring and therefore the pressure of the pressure roller at the pressure application position, and a second position at which the pressure spring applies its pressure directly to the spring seat to reduce said compression and pressure at the pressure application position.

5. The image forming device of claim 4, wherein the spring adjusting means includes rack means coupled to the adjusting member and pinion means operatively coupled to the rack means for the selective displacement of the adjusting member and setting of its desired pressure.

6. An image forming device including a photosensitive member including a plurality of microcapsules in its surface, each of the microcapsules containing at least a color former and a photosensitive material, the photosensitive material being superimposed on a sheet on which a visible image is to be created before or after the member is exposed to an optical image, the photosensitive member being subjected to pressure after exposure and while the sheet is developed, and the image is fixed, said device comprising:

a container for holding the photosensitive member;
an exposure means which exposes the photosensitive member to the optical image;
means for holding the sheet;
development means for superimposing the photosensitive member on the sheet and developing the sheet under pressure and including at least one pressure roller, the development means including pressure-adjusting means for adjusting the pressure applied by the at least one roller;
said pressure-adjusting means including the pressure spring positioned to apply pressure to the at least one roller and spring adjusting means for selectively adjusting the amount of pressure applied by said pressure spring when said roller is in said pressure application position; and
said spring adjusting means including a second spring positioned so that the force thereof is opposed to the force of the pressure spring and means for selectively applying the force of the second spring to adjust the effective force thereof, and therefore the pressure applied by the at least one pressure roller.

7. The image forming device of claim 6, wherein the pressure roller displacing means includes cam means in cooperative relation to the at least one pressure roller and displaceable between at least a no pressure position at which said at least one pressure roller is in its no pressure position and a pressure application position at which said at lest one pressure roller is at its pressure application position.

8. The image forming device of claim 7, wherein the cam means is rotatable, said pressure spring being positioned to apply its force to bias the cam means toward the pressure roller to transmit said force to said roller.

9. The image forming device of claim 8, wherein the second spring is positioned to apply its force to bias the cam means away from the pressure roller to nullify a portion of the force of the pressure spring and reduce the pressure of the pressure roller at is pressure application position.

10. The image forming device of claim 9, and including a bearing rotatably supporting said cam means, said pressure spring and said second spring being positioned to apply th respective forces on opposed sides of the bearing.

11. The image forming device of claim 9, wherein the spring adjusting means includes second spring lever means pivotably mounted with said second spring in competitive relation with one side of the pivot thereof, a force transmission member supported in said second spring lever means on the same side as said second spring for applying the force of the second spring to the cam means, and latch means for selectively engaging the second spring lever means to selectively hold the force transmission member out of cooperative engagement with the cam means to prevent the application of the force of the second spring thereto.

12. The image forming device of claim 11, and including means for displacing the latch means into and out of engagement with the second spring lever means.

13. The image forming device of claim 1, and including at least a second pressure roller for cooperation with the first mentioned pressure roller for the application of pressure to the sheet during development.

14. The image forming device of claim 1, and including at least a second pressure roller for cooperation with the first mentioned pressure roller for the application of pressure to the sheet during development.

15. The image forming device of claim 1, and including at least a second pressure roller for cooperation with the first mentioned pressure roller for the application of pressure to the sheet during development.

16. The image forming device of claim 1, including a means for detecting the type of sheet on which a visible image is created wherein said type of sheet detecting means detects the type of sheet in said sheet holding means.

17. The image forming device of claim 16, wherein said type sheet detecting means includes a plurality of detecting microswitches, said sheet holding means including means for cooperation with said microswitches for identifying the type of sheet therein.

18. An image forming device including a photosensitive member including a plurality of microcapsules in its surface, each of the microcapsules containing at least a color former and a photosensitive material, the photosensitive member being superimposed on a sheet on which a visible image is created before or after the member is exposed to an optical image, the photosensitive member being subjected to pressure after exposure and while the sheet is developed and the image is fixed, said device comprising:
- a container for holding the photosensitive member;
- an exposure device for exposing the photosensitive member to the optical image;
- means for holding the sheet;
- development means for superimposing the photosensitive member on the sheet and developing the sheet under pressure;
- thermal treating means for heating the developed sheet by radiation heat above the softening point of the material forming the visible image, said thermal treating means including a radiation heater facing at least the path of the pressurized sheet, a movable heat-insulating member mounted between the heater and the path of the sheet and means for selectively positioning the heat-insulating member along the path of the sheet to control the amount of heat applied to said sheet, said heat-insulating member positioning means adjusts the position of the heat insulating member relative to the speed of displacement of the sheet.

19. The image forming device of claim 18, and including means for adjusting the position of the heat insulating member relative to the speed of displacement of the sheet.

20. The image forming device of claim 18, wherein the thermal treating means includes a support member for supporting the sheet on its path and disposed between the heater and the sheet, the support member including support wire means extending in a direction not parallel to the direction of movement of the sheet.

21. The image forming device of claim 18, wherein the support member includes a guide member supporting the wire means.

22. The image forming device of claim 21, wherein the guide member includes a notched frame, the wire means including a single wire wrapped about said guide member and positioned in said notches.

23. The image forming device of claim 21, wherein the thermal treating means is formed as an integral unit.

24. The image forming device of claim 18, wherein the thermal treating means includes means for inserting the insulating member between the heater and the path of the sheet when the power to the thermal treating means is turned off.

25. The image forming device of claim 24, including means for moving the heat-insulating member to the desired position intermediate the path of the sheet and the heater, means biasing the heat-insulating member to a position between the heater and the path of the sheet, and means for decoupling the moving means from the heat-insulating member in response to power turn off.

26. The image forming device of claim 25, wherein the moving means includes a rack means coupled to the heat-insulating means; positioning motor means; gear train means coupling the positioning motor means and the rack means; said decoupling means including means for selectively displacing a gear of said gear train means for breaking the coupling between said rack means and said positioning motor means.

27. The image forming device of claim 26, wherein the decoupling means includes a lever means pivotable about a first gear of said gear train means, a second gear of said gear train means being rotatably mounted to said lever means for continuous operative coupling to the first gear and means for selectively pivoting the lever means between an on position at which the second gear is operatively coupled to a third gear of said gear train means and a power off position at which said second gear is not operatively coupled to said third gear.

28. The image forming device of claim 27, wherein said lever pivoting means includes solenoid means.

29. The image forming device of claim 28, wherein said solenoid means is a keep solenoid and including storage capacitor means in series with the solenoid and circuit means for charging the capacitor when the solenoid is displaced to the power on position and permitting discharge of the capacitor through the solenoid upon removal of power to displace the solenoid to the power off position.

30. The image forming device of claim 28, and including means for biasing the lever means to the power off position.

31. The image forming device of claim 25, wherein the means for biasing the heat-insulating member includes at least one spiral spring.

32. An image forming device including a photosensitive member including a plurality of microcapsules in its surface, each of the microcapsules containing at least a color former and a photosensitive material, and the photosensitive member is superimposed on a sheet on which a visible image is to be created before or after the member is exposed to an optical image, the photosensitive member being subjected to pressure after the exposure while the sheet is developed and the image is fixed, said device comprising:
- a container for holding the photosensitive member;
- exposure means which superimposed the optical image on the photosensitive member;
- container means for holding the sheet;
- development means which superimposes the photosensitive member on the sheet and develops the sheet under pressure;
- thermal treating means which thermally treats the developed sheet;
- gas-removing means for removing the gas produced in the thermal treating means, said gas-removing means including duct means coupled to the thermal treating means for discharging the gas produced and gas filter means in the duct means for removing a plurality of gaseous components, said gas removing device includes means for permitting the gas filter means to be installed and withdrawn; and said image forming device including monitor means which monitors the state of the gas filter means.

33. The image forming device of claim 32, wherein the gas filter means includes an operating portion that operates the monitor device.

34. The image forming device of claim 33, wherein said operating portion is a fuse mounted on said gas filter means, said mounting means including circuit means for detecting the presence of said filter means, detecting whether or not said fuse is open, and if said fuse is not green, applying a current to said fuse sufficient to open the fuse.

35. The image forming device of claim 34, and including sheet counter means for counting the sheets processed by the image forming device; said circuit means being further adapted, in conjunction with applying said fuse opening current, to reset said counter, and including means for turning off said image forming device when said counter reads a predetermined count.

36. The image forming device of claim 32, and including sheet couhter means for counting the sheets processed by the image forming device, said monitor means being adapted to detect insertion of a filter means and to reset said counter means in response to said insertion, and including means for turning off said image forming device when said counter reaches a predetermined count.

37. The image forming device of claim 36, wherein said monitor means being adapted to detect an unused filter means and to permit operation of said image forming device only in response to insertion of an unused filter means.

38. The image forming device of claim 32, wherein the gas filter means includes an adsorber and cover means supporting said adsorber for insertion and removal without the user touching the adsorber.

39. The image forming device of claim 38, wherein said cover includes a bottom sheet for catching liquid matter collected by the adsorber.

40. The image forming device of claim 38, wherein the adsorber is activated carbon.

41. The image forming device of claim 32, wherein the gas filter means includes activated carbon.

42. The image forming device of claim 32, wherein said gas-removing means includes a pre-filter including an auxiliary adsorbing portion and an absorbing member mounted on the upstream side of the gas filter means.

43. The image forming device of claim 42, wherein the adsorbing portion is in the form of a folded perforated sheet defining a plurality of perforated walls in the path of the gas, said adsorbing portion being mounted above the absorbing member.

44. The image forming device of claim 43, wherein the adsorbing portion is formed from a material selected from the group including metal, paper, plastic, cloth, ceramic and glass.

45. The image forming device of claim 44, wherein the adsorbing portion is formed from metal.

46. The image forming device of claim 45, wherein the adsorbing portion is formed from metal.

47. The image forming device of claim 45, wherein the absorbing member is positioned below the adsorbing portion and formed from a material selected from the group consisting of felt, paper, sponge and cloth.

48. The image forming device of claim 32, wherein said gas-re means includes a pre-filter mounted on the upstream side of the gas filter means.

49. The image forming device of claim 48, wherein the pre-filter is formed from a material selected from the group consisting of felt, porous paper, unwoven fabric, sponge, chemical fibers, steel fibers and cloth.

50. The image forming device of claim 32, wherein the duct means is mounted on a cover portion of the image forming device.

51. The image forming device of claim 32, wherein said gas filter means is mounted integral with the container holding the photosensitive member.

52. The image forming device of claim 32, and including exhaust fan means for drawing the gas from the thermal treating means.

53. A method for forming an image, comprising:
exposing a photosensitive member to an optical image, the photosensitive member including microcapsules containing at least a color former and a photosensitive material;
superimposing the photosensitive member on a sheet of paper on which a visible image is created;
developing the sheet under pressure;
varying the pressure applied to the sheet with a pressure-adjusting device, including a pressure spring positioned to apply pressure to at least one pressure roller, and spring adjusting means for selectively adjusting the amount of pressure applied by said pressure spring when said roller is in said pressure application position;
said spring adjusting means including means for selectively adjusting the amount of compression of the pressure spring; and
said pressure roller displacing means including pivotable first lever means supporting at one side of the pivot theeof said at least one pressure roller and havign at the other side thereof a spring seat; and
displaceable cam means and cam follower means engaging said cam means and supporting said pressure spring for displacement of the pressure spring into and out of cooperative relation with the spring seat to displace the pressure roller in response to the displacement of the cam means.

54. The method of claim 53, further including the step of thermally treating the developed sheets.

55. A method for forming an image, comprising:
exposing a photosensitive member to an optical image, the photosensitive member including microcapsules containing at least a color former and a photosensitive material;
superimposing the photosensitive member on a sheet of paper on which a visible image is created;
developing the sheet under pressure;
removing the gases produced in the thermal treating step;
filtering the gas removed during the thermal treating step; and
controlling the operations of the process in response to the presence and state of the filter.

56. A method for forming an image, comprising:
exposing a photosensitive member to an optical image, the photosensitive member including microcapsules containing at least a color former and a photosensitive material;
superimposing the photosensitive member on a sheet of paper on which a visible image is created;
developing the sheet under pressure; and
selectively controlling the amount of heat applied to the developed sheet by positioning a heat-insulating member between an the source of heat and the path of the sheet; and changing the position of the heat insulating member relative to the speed of displacement of the sheet.

57. A method for forming an image, comprising:

exposing a photosensitive member to an optical image, the photosensitive member including microcapsulaes containing at least a color former and a photosensitive material;

superimposing the photosensitive member on a sheet of paper on which a visible image is created;

developing the sheet under pressure; and selectively controlling the amount of heat applied to the developed sheet by positioning a heat-insulating member between an the source of heat and the path of the sheet; and essentially cutting off heat from the sheet when power is cut off.

58. The image forming device of claim 1, further including a thermal treating device for thermally treating the developed sheet.

59. The method of claim 54, further including the step of removing the gas produced in the thermal treating step.

* * * * *